(12) United States Patent
 Sinha et al.

(10) Patent No.: US 9,866,664 B2
(45) Date of Patent: Jan. 9, 2018

(54) SYSTEMS AND METHOD FOR ASSESSING A MOBILE DEVICE

(71) Applicant: Intelliboxes Group Limited, London (GB)

(72) Inventors: Somnath Sinha, London (GB); Ranjith Tharayil Suresh, London (GB)

(73) Assignee: INTELLIBOXES GROUP LIMITED, London (GB)

( * ) Notice: Subject to any disclaimer, the term of this patent is extended or adjusted under 35 U.S.C. 154(b) by 0 days.

(21) Appl. No.: 15/654,037

(22) Filed: Jul. 19, 2017

(65) Prior Publication Data

US 2017/0318140 A1    Nov. 2, 2017

Related U.S. Application Data

(63) Continuation of application No. PCT/IB2016/001578, filed on Oct. 11, 2016.
(Continued)

(51) Int. Cl.
*G06K 9/48* (2006.01)
*H04M 1/24* (2006.01)
(Continued)

(52) U.S. Cl.
CPC ............ *H04M 1/24* (2013.01); *G06T 7/13* (2017.01); *H01L 23/552* (2013.01); *H04M 1/0249* (2013.01)

(58) Field of Classification Search
CPC ......... H04M 1/24; H04M 1/0249; G06T 7/13; H01L 23/552
See application file for complete search history.

(56) References Cited

U.S. PATENT DOCUMENTS 5,373,102 A    12/1994  Ehrlich et al.
5,761,053 A     6/1998  King et al.
(Continued)

FOREIGN PATENT DOCUMENTS

WO    WO-2010/128315 A1    11/2010
WO    WO-2013/171727 A1    11/2013

OTHER PUBLICATIONS

Search Report and Written Opinion in International Application No. PCT/IB2016/001578 dated May 2, 2017, 31 pages.

*Primary Examiner* — David F Dunphy
(74) *Attorney, Agent, or Firm* — Marshall, Gerstein & Borun LLP

(57) ABSTRACT

An apparatus for assessing a mobile device comprises a housing with a faraday cage. The faraday cage may include a chamber having an ingress mechanism allowing a user to position the mobile device within the chamber, a wireless transceiver coupled to one or more antennas, and one or more imaging devices. The apparatus may also include one or more processors communicatively coupled to the wireless transceiver and the imaging device(s). When the mobile device is positioned within the chamber, the processor(s) may use the wireless transceiver to establish a wireless communication link with the mobile device, and use the imaging device(s) to capture one or more images of the mobile device. Alone or in conjunction with a remote server, the apparatus may use information obtained from the mobile device, and/or one or more images of the mobile device, to assess the mobile device for various purposes.

20 Claims, 12 Drawing Sheets

Related U.S. Application Data

(60) Provisional application No. 62/253,312, filed on Nov. 10, 2015.

(51) Int. Cl.
*G06T 7/13* (2017.01)
*H01L 23/552* (2006.01)
*H04M 1/02* (2006.01)

(56) References Cited

U.S. PATENT DOCUMENTS

| | | |
|---|---|---|
| 2012/0094668 A1 | 4/2012 | Vratskides |
| 2013/0124426 A1* | 5/2013 | Bowles ............... G06Q 99/00 705/308 |
| 2013/0144797 A1 | 6/2013 | Bowles et al. |
| 2013/0191236 A1 | 7/2013 | Bowles |
| 2015/0055687 A1* | 2/2015 | Phan ............... H04L 63/0815 375/140 |
| 2015/0120485 A1 | 4/2015 | Nash |
| 2016/0098690 A1* | 4/2016 | Silva .................. G06Q 10/30 705/21 |
| 2016/0210648 A1* | 7/2016 | Cirannek ............. G06Q 10/30 |

* cited by examiner

SYSTEMS AND METHOD FOR ASSESSING A MOBILE DEVICE

CROSS-REFERENCE TO RELATED APPLICATION

This application is a continuation of Application No. PCT/IB2016/001578, entitled "Systems and Methods for Assessing a Mobile Device" and filed on Oct. 11, 2016. This application claims the benefit of, and priority to, U.S. Provisional Patent Application No. 62/253,312, entitled "Systems and Methods for Assessing a Mobile Device" and filed on Nov. 10, 2015. Each of the above-listed applications is hereby incorporated herein by reference in its entirety.

TECHNICAL FIELD

The present disclosure generally relates to systems and methods for capturing information about a mobile device, and using that information for various purposes.

BACKGROUND

Mobile devices such as mobile phones have become ubiquitous over the past twenty years. The number of mobile devices used worldwide is estimated to be in the billions. Many telecommunication companies offer promotions that are targeted towards upgrading to a new model of a mobile device. Commonly, the offered promotions enable an individual to trade in his or her current mobile device in order to receive a credit towards the new mobile device and/or a service plan. Typically the process of receiving the credit begins with a visual inspection of the current mobile device by an employee at a retail store. The employee may be tasked to perform the visual inspection by determining the make and model, and inspecting one or more aspects of functionality in addition to physical defects before deciding on a condition of the phone. Depending on various factors (e.g., the number of customers at a retail store, staffing issues, ordering a mobile device via the Internet, etc.) the process may not be started and/or completed, or may be subject to human error. In some instances, the individual may end up not submitting their current mobile device and thereby forfeiting the credit. In those instances, the mobile device may be stored at the individual's home only to be disposed of at a later point in time.

SUMMARY

Example systems and methods for assessing a mobile device, and using the assessment for various purposes, are herein described.

In accordance with a first example aspect, an apparatus for assessing a mobile device is disclosed. The apparatus includes a housing including a faraday cage. The faraday cage includes a chamber that has an ingress mechanism. The ingress mechanism is configured to enable a user to position the mobile device within the chamber. The apparatus also includes one or more antennas that are at least partially disposed within the faraday cage. The apparatus also includes a wireless transceiver that is coupled to the one or more antennas. The apparatus also includes one or more illuminating components that are configured to provide illumination within the chamber of the faraday cage. The apparatus also includes one or more imaging devices. The apparatus also includes one or more processors that are communicatively coupled to the wireless transceiver and the one or more imaging devices. The one or more processors are configured to use the wireless transceiver to establish a wireless communication link with the mobile device when the mobile device is positioned within the chamber. The one or more processors are also configured to use the one or more imaging devices to capture one or more images of the mobile device when the mobile device is positioned within the chamber.

In accordance with a second example aspect, a computer-implemented method for assessing a mobile device is disclosed. The method includes causing, by one or more processors, a wireless communication link to be established with a mobile device positioned within a chamber of a faraday cage. The method also includes receiving, by the one or more processors and via the wireless communication link, information indicative of identification of the mobile device. The method also includes determining, by the one or more processors, a make and a model of the mobile device based on the information indicative of identification of the mobile device. The method also includes capturing, by one or more imaging devices, one or more images of the mobile device while the mobile device is positioned within the chamber. The method also includes determining, by the one or more processors, a condition of the mobile device based on the one or more images of the mobile device. The method also includes determining, by the one or more processors, a monetary value of the mobile device based on (i) the make and the model of the mobile device and (ii) the determined condition of the mobile device. The method also includes providing for display to a user, by the one or more processors, an assessment of the mobile device, wherein the assessment of the mobile device includes one or both of (i) the determined condition and (ii) the determined monetary value.

In accordance with a third example aspect, a computer-implemented method for assessing a mobile device is disclosed. The method includes causing, by one or more processors, a wireless communication link to be established with a mobile device positioned within a chamber of a faraday cage. The method also includes receiving, by the one or more processors and via the wireless communication link, information indicative of identification of the mobile device. The method also includes capturing, by one or more imaging devices, one or more images of the mobile device while the mobile device is positioned within the chamber. The method also includes transmitting, by the one or more processors, (i) the information indicative of identification of the mobile device and (ii) the captured one or more images of the mobile device to a remote server configured to assess the mobile device. The method also includes in response to transmitting to the remote server, receiving, by the one or more processors, one or both of (i) a condition of the mobile device and (ii) a monetary value of the mobile device. The method also includes providing for display to a user, by the one or more processors, an assessment of the mobile device, wherein the assessment of the mobile device includes one or both of (i) the condition of the mobile device and (ii) the monetary value of the mobile device.

In accordance with a fourth example aspect, an apparatus for assessing a mobile device is disclosed. The apparatus includes a housing including a faraday cage. The faraday cage comprises a drawer for receiving the mobile device. The apparatus also includes one or more antennas at least partially disposed within the faraday cage. The apparatus also includes a wireless transceiver coupled to the one or more antennas. The apparatus also includes one or more illuminating components configured to provide illumination within the drawer. The apparatus also includes one or more imaging devices. The apparatus also includes a display coupled to the housing and configured to receive a user input. The apparatus also includes an actuator configured to move the drawer between an open position and a closed position. The apparatus also includes one or more processors communicatively coupled to the wireless transceiver and the one or more imaging devices. The one or more processors are configured to use the wireless transceiver to establish a wireless communication link with the mobile device when the mobile device is positioned within the drawer and while the drawer is in the closed position. The one or more processors are also configured to capture information indicative of identification of the mobile device using the established wireless communication link. The one or more processors are also configured to use the one or more imaging devices to capture one or more images of the mobile device while the mobile device is positioned within the drawer and the drawer is in the closed position. The one or more processors are also configured to use the display to provide an assessment of the mobile device based on one or both of (i) the captured information indicative of identification and (ii) the captured one or more images of the mobile device.

BRIEF DESCRIPTION OF THE DRAWINGS

The figures described below depict various aspects of the systems and methods disclosed herein. It should be understood that each figure depicts an embodiment of a particular aspect of the disclosed system and methods, and that each of the figures is intended to accord with a possible embodiment thereof. Further, where possible, the following description refers to the reference numerals included in the following figures, and features depicted in multiple figures are designated with consistent reference numerals.

DETAILED DESCRIPTION

Figure 1:
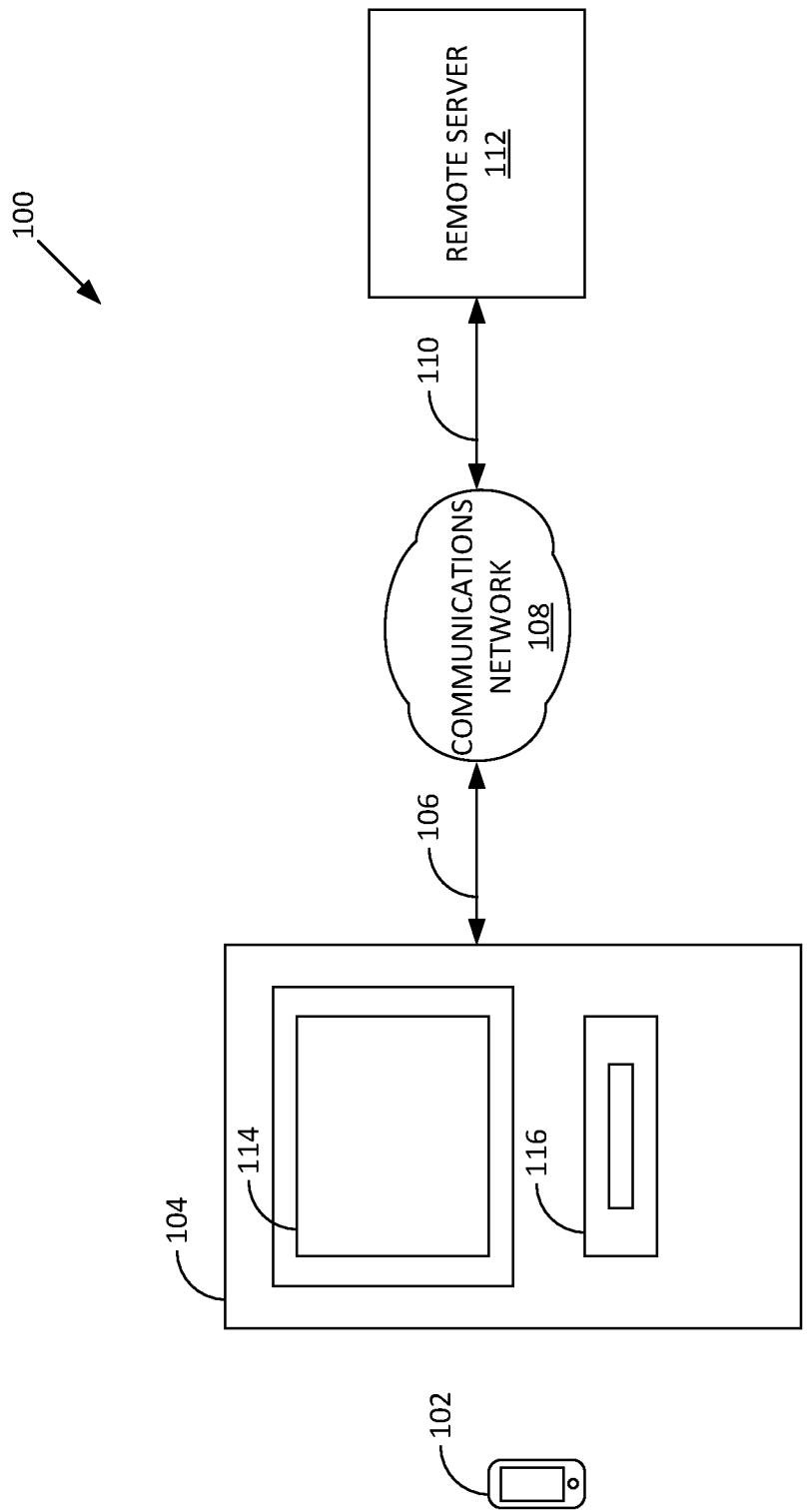
FIG. 1 is a block diagram of an example system for assessing a mobile device, according to an embodiment of the present disclosure.

In some embodiments of the present invention, the time, costs and errors associated with a visual inspection of a mobile device, and/or other manual information gathering techniques, may be reduced by using an apparatus configured to assess the mobile device. The apparatus may be a kiosk or a part of a kiosk, for example. The apparatus may include a housing that includes a faraday cage. The faraday cage may include a chamber for receiving the mobile device. To collect information about the mobile device, the apparatus may also include a wireless transceiver and/or one or more imaging devices. In one example embodiment, the apparatus may be configured to use the wireless transceiver to establish a wireless (e.g., cellular) communication link with the mobile device, and to use the one or more imaging devices to capture one or more images of the mobile device. To allow images to be captured while the chamber is sealed or closed, one or more illuminating components may be disposed within the chamber.

The faraday cage may include one or more low resistance metals, such as aluminum. The faraday cage may be formed as a structure with minimal external discontinuities. As an example, the spacing of fasteners used on the back side of the faraday cage may be placed at short distances (e.g., 1.5 to 3.5 cm) from each other in order to bring the surfaces as close as possible and thereby attenuate any unwanted radio frequency (RF) signals entering the faraday cage and any RF signals exiting the faraday cage. Further, one or more cables that are used with the faraday cage (e.g., to provide power, control, data, etc.) may be wrapped with an RF blocking material in order to assist with RF attenuation.

The chamber may include an ingress mechanism (e.g., a moveable/sliding drawer) that is configured to enable a user to position the mobile device within the chamber. As an example, the ingress mechanism may include an actuator for enabling the mechanism to open and close. In another example, the ingress mechanism may include a sliding door that is configured to be moved by the user to provide access to the chamber. The ingress mechanism may include one or more layers of an RF/electromagnetic interference (EMI) absorber, and one or more EMI gaskets, in order to help attenuate RF signals entering or exiting the chamber.

In one example, the wireless transceiver may be coupled to one or more antennas and configured to establish a wireless communication link with the mobile device. The one or more antennas may be at least partially disposed within the faraday cage in order to communicate with a mobile device positioned within the faraday cage. In one embodiment, the wireless communication link may be established by configuring the wireless transceiver as a base station of a picocell, with the mobile device connecting to the picocell while in a roaming mode, or while in a handover mode. The mobile device may be prevented from joining or linking to other, external cells as a result of the RF attenuation provided by the faraday cage.

Once a link is established between the mobile device and the wireless transceiver, information indicative of identification of the mobile device may be obtained from the mobile device via the link. The identification information may include an international mobile station equipment identity, and/or an international mobile subscriber identity, for example.

The one or more illuminating components may be configured to provide illumination. The illuminating component(s) may be activated in response to detecting that the mobile device is within the chamber, for example. Alternatively, the illuminating component(s) may be activated in response to opening or closing of the ingress mechanism, or another suitable trigger.

The one or more imaging devices may be configured to capture at least two sides of the mobile device. For example, a first camera located within the faraday cage may be configured to capture the front side of the mobile device, and a second camera located within the faraday cage may be configured to capture the rear side of the mobile device.

The apparatus may be configured to use the obtained identification information to determine a make and a model of the mobile device, and may use the captured one or more images of the mobile device to determine a condition of the mobile device. For instance, the identification information may be cross-referenced with the device make and model, and the captured one or more images may be analyzed to detect one or more physical defects (e.g., scratches to a display of the mobile device, indentations to one or more sides of the mobile device, etc.) and determine an overall condition based on the defects. In alternative embodiments, the apparatus sends the identification information and/or captured image(s) to a remote server via a network, and the remote server determines the make, model and condition. The remote server may then send the determined information back to the apparatus via the network.

The apparatus, or a remote server in communication with the apparatus, may be configured to provide an assessment of the mobile device based on the determined make and model of the mobile device and/or the determined condition. The assessment may include a monetary value of the mobile device, and/or the characteristics or parameters of the mobile device that are used to estimate or determine that value (e.g., the make, model, condition assessment or score, etc.). The assessment may then be provided for display to a user of the mobile device (e.g., using a display of the apparatus).

In one example implementation, the apparatus may be positioned within a retail store affiliated with a telecommunication service. An individual may use the apparatus to assess the mobile device at the retail store without the assistance of an employee, for example. Upon completion of the assessment, the apparatus may display of a monetary value of the mobile device. The individual may then have the option to choose to submit the mobile device to an employee of the retail store in exchange for a credit and/or cash based on the monetary value. Alternatively, the individual may choose to exchange/submit the mobile device by selecting a virtual control (e.g., button on the display) or mechanical control (e.g., lever arm or physical button) on the apparatus, which causes an extraction mechanism to move the mobile device from the chamber to a mobile device collection area. The device may then be collected and recycled at a later time, for example.

In another example implementation, the apparatus may be positioned within a facility affiliated with a shipping service. In this example, an individual may receive the assessment of the mobile device and choose to use the shipping service to send the mobile device to an interested party (e.g., telecommunication service provider, third-party reseller, etc.) in exchange for the credit based on the monetary value. The individual may save time by not having to visit more than one location in order to ship the mobile device. Other examples implementations and locations are possible as well.

Referring now to the figures, FIG. 1 is a diagram of an example system 100 capable of performing an assessment of a mobile device 102. The mobile device 102 may be a smartphone or other mobile telephone capable of cellular communication, for example. Alternatively, in some embodiments, the mobile device may be a tablet device, or another device capable of communicating via a cellular network. In addition to the mobile device 102, the system 100 includes an assessment apparatus 104, a communications network 108, and a remote server 112. The assessment apparatus 104 and the remote server 112 may communicate via the communications network 108 and the communication channels 106 and 110.

The assessment apparatus 104 may be a kiosk, for example. Within the assessment apparatus 104 is a display 114 and an internal housing 116. The assessment apparatus 104 may also include one or more processors (not shown in FIG. 1) that execute software instructions (stored in a persistent memory not shown in FIG. 1) to enable the various operations and functions of the assessment apparatus 104 as described below. The display 114 may be a touch screen or, alternatively, the assessment apparatus 104 may include a keyboard or other user input mechanism (not shown in FIG. 1). For ease of explanation, however, the discussion below refers to embodiments in which the display 114 is a touch screen.

The housing 116 may include a faraday cage that includes or defines a chamber having an ingress mechanism. The ingress mechanism may be configured to enable a user to position the mobile device 102 within the chamber. In one example, the ingress mechanism may comprise a moveable drawer configured to move between an open position and a closed position. The moveable drawer may be configured to receive the mobile device 102 when in the open position. Further details of the housing 116 (and the chamber, ingress mechanism, etc.) are provided in connection with FIGS. 2 and 3, according to various embodiments.

The assessment apparatus 104 may include a wireless transceiver (not shown in FIG. 1) for communicating with the mobile device 102 when the mobile device 102 is positioned within the chamber. The wireless transceiver may be coupled to one or more antennas that are at least partially disposed within the faraday cage. The assessment apparatus 104 may configure the wireless transceiver (and possibly other processors/circuitry within the assessment apparatus 104) as a base station to support an active cell of a cellular communication network (e.g., a picocell, a femtocell, etc.). The wireless transceiver may support one or more cellular technologies (e.g., 2G, 3G, 4G, etc.). When the mobile device 102 is positioned within the chamber, the mobile device can then connect to the cell (e.g., in a roaming mode or a handover mode), and exchange information with the assessment apparatus 104. The cage itself provides a high level of RF signal attenuation to prevent the mobile device 102 from instead forming a communication link with an external entity or device (e.g., a base station of another cell), and generally to prevent interference with the desired communications between the mobile device 102 and the assessment apparatus 104. In one example, the cell operates within a frequency range of about 1800 to 1900 megahertz, and the faraday cage is configured to attenuate electromagnetic/RF signals within that frequency range that enter or exit the chamber by at least 50 dB (or by at least 65 dB, etc.). In some alternative embodiments, the wireless communication link established with the mobile device 102 may utilize other, non-cellular technologies. For ease of explanation, however, the discussion below primarily refers to an embodiment in which a cellular communication technology is used.

In one embodiment, the assessment apparatus 104 activates the cell (e.g., starts sending out beacons, etc.) in response to detecting a user input at the touchscreen of display 114. In another embodiment, the assessment apparatus 104 activates the cell in response to detecting that the drawer or other ingress mechanism of the housing 116 is closed while a mobile device (e.g., mobile device 102) is present in the chamber, or in response to another suitable trigger. The closed state of the ingress mechanism may be detected by a sensor such as a Hall effect sensor, and the presence of a mobile device may be detected by a weight or pressure sensor, for example.

The assessment apparatus 104 may request the international mobile station equipment identity (IMSEI) and/or international mobile subscriber identity (IMSI) of the mobile device 102, and receive the IMSEI and/or IMSI in response, via the established cellular link. The IMSEI and/or IMSI may be used to determine a make of the mobile device 102, a model of the mobile device 102, and/or other information about the mobile device 102 and/or the user of the mobile device 102, as discussed further below. In other embodiments, other information indicative of the identity of the mobile device 102 may also, or instead, be obtained by the assessment apparatus 104 via the cellular link. For ease of explanation, however, the description below refers primarily to IMSEI and IMSI.

The one or more imaging devices of the assessment apparatus 104 may be configured to capture one or more images of the mobile device 102 while the mobile device 102 is positioned within the chamber. The imaging device(s) may include any number of photosensors, photodiodes, photomultipliers, or other image sensor types, including charge-coupled-devices (CCD), complementary metal-oxide semiconductor (CMOS) sensors, etc., or some combination therefore. In some instances, the one or more imaging devices may be a single-camera setup that is capable of capturing video, photo, infrared, etc. Depending on the type of imaging device(s) used, one or more illuminating components may assist in capturing the one or more images.

The illuminating component(s) may be configured to provide illumination within the chamber, and the assessment apparatus 104 may activate and de-activate the illuminating component(s) as needed. In one example, the assessment apparatus 104 activates the illuminating component(s) in response to detecting that the mobile device 102 is positioned within the chamber (e.g., using a weight or pressure sensor) with the drawer closed (e.g., using a Hall effect sensor), and de-activates the illuminating component(s) in response to detecting that the mobile device 102 is no longer positioned within the chamber and/or detecting that the drawer is open.

As shown in FIG. 1, the assessment apparatus 104 may be in operative communication with the remote server 112 via the communications network 108 and the communication channels 106, 110. Communication sent through communication channels 106 and 110 and the communications network 108 may be encrypted or otherwise secured. In one example, the communications network 108 may include the Internet and one or more local Ethernet networks. Generally, the communications network 108 may include one or more wired and/or wireless networks, including local area and/or wide area networks.

In operation, the assessment apparatus 104 may send the IMSI and/or IMSEI collected from the mobile device 102, as well as the image(s) of the mobile device 102 captured by the imaging device(s), to the remote server 112 via the communications network 108. The remote server 112 may then analyze the received information, and return the results of the analysis to the assessment apparatus 104. To perform the analysis and return the results, the remote server 112 may include one or more processors executing software instructions stored in a persistent memory of the remote server 112 (not shown in FIG. 1).

The analysis performed by the remote server 112 may include identifying a type of the mobile device 102 (e.g., make, model, etc.), assessing a physical condition of the mobile device 102, and/or estimating a monetary value based on the device type and/or physical condition, for example. To identify the device type, the remote server 112 may access one or more databases (not shown in FIG. 1) to retrieve information corresponding to the received IMSI and/or IMSEI. The remote server 112 (or another server not shown in FIG. 1) may also use the IMSI and/or IMSEI to determine other information associated with the mobile device 102, such as the service provider used by the mobile device 102 and/or the amount of time remaining on a contract with the service provider, for example.

In some embodiments, a user may use the touchscreen of the display 114 to enter information that at least partially identifies the mobile device 102, and the assessment apparatus 104 may send that information to the remote server 112 to assist with the assessment/analysis. For example, the user may provide his or her telecommunication service provider, the make and/or model of the mobile device 102, the storage capacity of the mobile device 102, and/or other information via the display 114. In other embodiments, no such information from the user is used during the assessment.

To assess the physical condition of the mobile device 102, the remote server 112 may perform image processing techniques (e.g., edge detection techniques, etc.) on the received image(s) to detect cracks and/or other blemishes or imperfections apparent on the exterior of the mobile device 102. Based on the image processing, the remote server 112 may generate a text-based and/or image-based report reflecting the assessment (e.g., an image highlighting a crack, or a text description of the crack), and/or assign the mobile device 102 a "score" corresponding to the overall physical condition of the mobile device 102 (e.g., "fair," "A−," "91/100," etc.). In some embodiments, the physical condition of the mobile device 102 is determined based not only on the image(s), but also on other information about the mobile device 102. For example, if the IMSI and/or IMSEI is used to determine the make and model, or if the user entered the make and model via the display 114, then the remote server 112 may use that information to retrieve one or more stock images of a mobile device that is of the same type, but in perfect condition. The image processing techniques may then be used to compare features of the images in an effort to detect cracks or other imperfections.

In other embodiments, the remote server 112 may send the image(s) to a computing device having a user interface (or the remote server 112 itself may have a user interface), and the image(s) may be reviewed via the user interface to manually assess the physical condition of the mobile device 102 without any direct interaction with the mobile device 102 or its user. The individual performing the review may then enter information indicative of his or her assessment, and the remote server 112 may store that information for use in its assessment.

Based on the type (e.g., make and model) of the mobile device 102 and the physical condition of the mobile device 102, the remote server 112 may estimate a monetary value of the mobile device 102. The monetary value may be the intrinsic value of the mobile device 102 itself, or may also take into consideration other factors (e.g., service provider, amount of time remaining on a current contract, etc.), if known. The remote server 112 may then send the monetary value to the assessment apparatus 104, and the assessment apparatus 104 may display the monetary value to the user of the mobile device 102 via the display 114.

In some embodiments, some of the operations described above are instead performed by different components of the system 100. In one such embodiment, the assessment apparatus 104 is configured to implement all of the functionality described above with respect to the remote server 112, and the communications network 108 and remote server 112 may be omitted from the system 100, or the remote server 112 may instead be a local server within assessment apparatus 104. For example, the assessment apparatus 104 may, by itself, establish a picocell to obtain an IMSI and/or IMSEI from the mobile device 102, use cameras to capture one or more images of the mobile device 102, use the IMSI and/or IMSEI to determine the make and model of the mobile device 102 using a local database, use the captured image(s) and an image processing technique to estimate a physical condition of the mobile device 102 (or display the image(s) on the display 114 so that an attendant can make a manual assessment of physical condition, etc.), estimate a monetary value based on the make, model and physical condition, and display the monetary value to the user via display 114.

After the assessment apparatus 104 presents results of the assessment (e.g., a monetary value, and possibly underlying information such as make, model, physical condition, etc.) to the user via the display 114, the user may be presented with an option to accept or reject a transaction having terms based on that assessment. For example, the display 114 may indicate that the exchange value of the mobile device 102 is $80, so long as the user exchanges the mobile device 102 for a particular new mobile device and/or service plan. The user may then accept the offer (e.g., by pressing a first button on a touch screen of display 114) or reject the offer (e.g., by pressing a second button on the touch screen). In some embodiments, if the user accepts the offer, an extraction mechanism of the chamber automatically causes the mobile device 102 to be moved from the chamber to a repository/storage area for later collection. In another embodiment, the user manually removes his or her mobile device, and the assessment apparatus 104 prints out a ticket or report showing the monetary value and the date/time of the assessment. The user may then give the ticket or report and the mobile device 102 to an attendant, for example, and receive a new mobile device in return.

Figure 2:
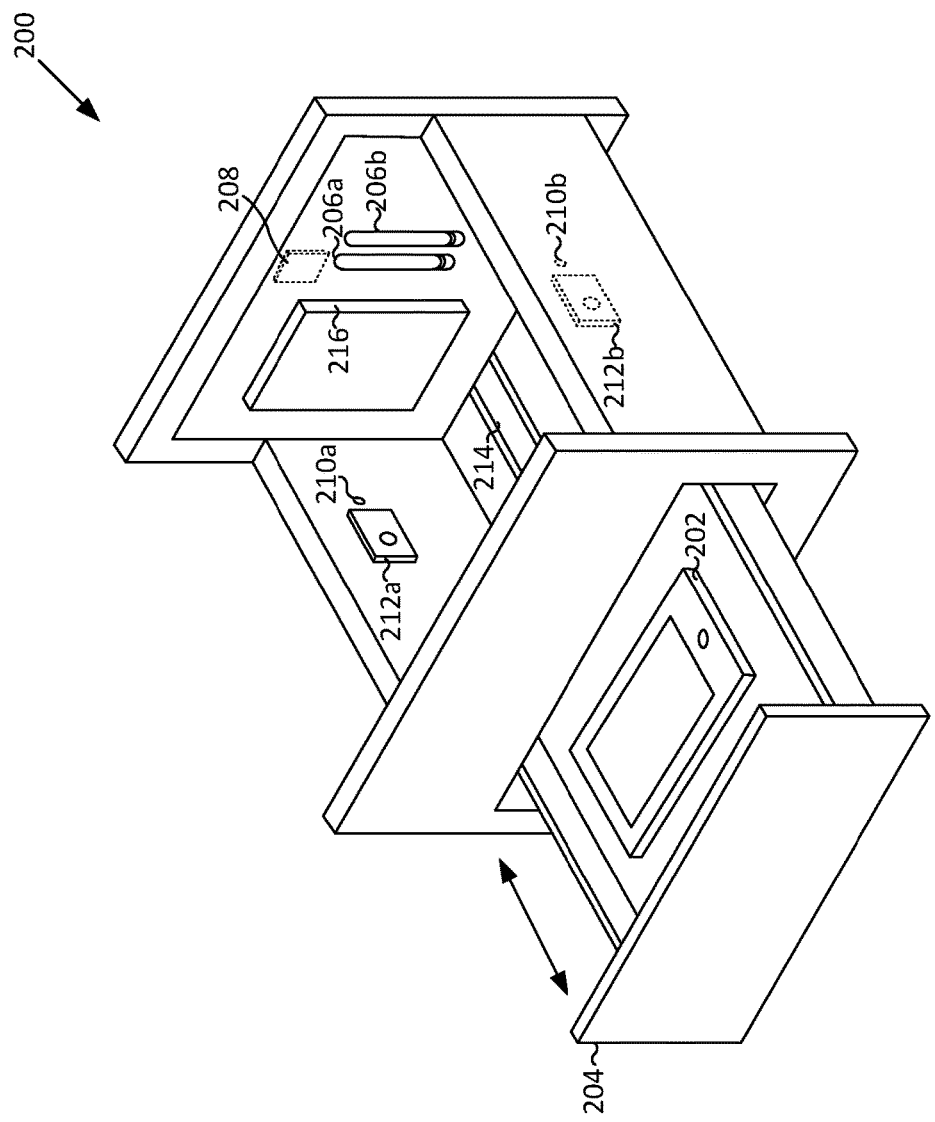
FIG. 2 depicts a portion of an example housing that may be used in the example system of FIG. 1, according to an embodiment of the present disclosure.

FIG. 2 depicts an example housing 200, according to an embodiment. The housing 200 may be used as the housing 116 of FIG. 1, for example. A top surface/portion of the housing 200 is not shown in FIG. 2 in order to provide a clearer view of the internal components. As shown in FIG. 2, the housing 200 includes a moveable/sliding drawer 204. At least a portion of each of antennas 206a and 206b is disposed within the housing 200. The antennas 206a, 206b may be patch antennas, or any other suitable type of antenna. In other embodiments, there are more or fewer than two antennas 206a, 206b. Coupled to the antennas 206a, 206b is a wireless transceiver 208, which may be inside or outside the housing 200.

The housing 200 also includes illuminating components 210a and 210b, and imaging devices 212a and 212b. The imaging devices 212a, 212b may be of any of the types mentioned above in connection with FIG. 1 (e.g., CCD, etc.), for example. In other embodiments, the housing 200 includes more or fewer than two illumination components 210a, 210b, and/or more or fewer than two imaging devices 212a, 212b. The housing 200 also includes an actuator 214. One or more processors 216 may also be included in the housing 200, or external to the housing 200 (e.g., elsewhere in an apparatus such as the assessment apparatus 104 of FIG. 1).

The actuator 214 may be configured to move the drawer 204 to an open position, thereby allowing for placement of the mobile device 202 within the drawer 204. In some embodiments, the actuator 214 is "activated" by placing the drawer 204 in an open position. In one example, the processor(s) 216 may be configured to activate the actuator 214 based on a received user input (e.g., an input on display 114 of FIG. 1). Alternatively, or additionally, the processor(s) 216 may be configured to activate the actuator 214 upon completion of the assessment of the mobile device 202, or based on another suitable trigger. The actuator 214 may be an electric linear actuator. In one embodiment, the actuator 204 includes a limit switch with a spring actuator.

The drawer 204 is large enough to receive the mobile device 202. In one embodiment, the drawer 204 includes a transparent bottom surface (e.g., glass, plastic, etc.) that permits an image to be captured through the transparent surface. In this embodiment, at least one of imaging devices 212a, 212b is positioned below the transparent surface and is configured to capture an image of the down-facing side of the mobile device 202. In another embodiment, the drawer 204 may include a spring-loaded slot (not shown in FIG. 2) that allows the mobile device 202 to be held upright while resting on one of its four narrow edges, so that the imaging devices 212a, 212b can capture images of both of larger surfaces (i.e., the display side and the reverse side of the mobile device 202). In yet another embodiment, the drawer 204 may include a mechanism that allows the mobile device 202 to be automatically rotated for capturing multiple sides of the mobile device 202. Upon closing the drawer 204, a faraday cage is formed by the housing 200. The faraday cage provides a high level of attenuation for any RF/EMI signals entering or exiting the cage (e.g., at least 65 dB, or at least 50 dB, etc.), at least at certain frequencies or frequency ranges of interest.

As noted above, antennas 206a and 206b are at least partially disposed within the faraday cage, to support communication with the mobile device 202 even when the drawer 204 is closed. In one example, the wireless transceiver 208 is configured to operate according to one or more channel access methods (e.g., frequency division multiple access, code division multiple access, time division multiple access, etc.) in order to obtain the IMSI and/or IMSEI of the mobile device 202. In particular, the processor(s) 216 may configure the wireless transceiver 208 to operate according to one or more of various worldwide standards for cellular networks and mobile phone usage (e.g., 2G, 3G, 4G, etc.). In one embodiment, when the drawer 204 is in the closed position, the mobile device 202 cannot connect to any external cells due to the isolation of the faraday cage, and therefore enters a roaming mode or a handover mode and connects to a picocell (or femtocell, etc.) established by the processor(s) 216, the wireless transceiver 208, and the antennas 206a, 206b. The attenuation of RF signals provided by the faraday cage of assessment apparatus 200 may cause the mobile device 202 to establish a connection via the antennas 206a and 206b and wireless transceiver 208, rather than an external transceiver (e.g., a telecommunication service base station). Once the mobile device 202 is in communication with the wireless transceiver 208, the processor(s) 216 may obtain the IMSI and/or IMSEI of the mobile device 202 as described above in connection with FIG. 1.

Illuminating components 210a and 210b may include light emitting diodes (LEDs), and/or other types of illumination sources, that can be controlled by the one or more processors 216. In one example, the illuminating components 210a and 210b may include a diffuser configured to spread the light evenly across the mobile device 202. In another example, the illuminating components 210a and 210b may be configured to provide multiple colors of illumination based on one or more preferred colors of light associated with image processing. For instance, the illuminating components 210a and 210b may be configured to emit a red light, a blue light, and a green light at different times in order to capture images under each setting of light. In this embodiment, the multiple images may then be combined in order provide a high-resolution, multi-color image.

In one embodiment, the imaging devices 212a and 212b may be positioned at least 4 cm away from the mobile device 102 in order to obtain more clarity and capture images suitable for analysis. The imaging device 212a and 212b may be positioned within the housing 200 at various angles along one or more surfaces. In one instance, the imaging devices 212a and 212b may be placed at approximately thirty degree angles relative to a top surface or a bottom surface of the faraday cage.

The processor(s) 216 may be communicatively coupled to the wireless transceiver 208, the illuminating components 210a, 210b, the imaging devices 212a and 212b, and/or the actuator 214 in order to control one or more functions associated with assessing the mobile device 202. The processor(s) 216 may also be configured to communicate with other computing devices (e.g., the remote server 112 of FIG. 1) via a communication interface not shown in FIG. 2. Generally, the processor(s) 216 may be configured to perform, or cause to be performed (e.g., by sending commands to, and/or receiving data from, the wireless transceiver 208, the illuminating components 210a, 210b, the imaging devices 212a, 212b, etc.), some or all of the functions of the assessment apparatus 104 described above in connection with FIG. 1.

In one embodiment, the drawer 204 may include an extraction mechanism (not shown in FIG. 2) for automatically placing the mobile device 202 into a repository/storage area for later collection and recycling, as discussed above in connection with FIG. 1. For example, the drawer 204 may include a "trap door" component, and/or a mechanism for pushing the mobile device 202 into a temporary opening formed by the trap door. The extraction mechanism may be subject to manual control (e.g., the user of the mobile device 202 pulling a lever), or may be subject to electronic control (e.g., the processor(s) 216 sending a command to extract the mobile device 202 in response to a user accepting a proposed transaction). Once stored, the mobile device 202 can be retrieved at a later point in time by the appropriate party.

In another example, the drawer 204 may include a weight or pressure transducer (also not shown in FIG. 2). The weight or pressure transducer may be configured to determine the weight of the mobile device 202. The processor(s) 216 may be coupled to the transducer, and may be configured to compare the determined weight of the mobile device 202 with a plurality of known mobile phone weights (e.g., obtained from a database) in order to determine whether the object placed within the drawer 204 is a mobile phone. The knowledge that a mobile device is placed within the drawer 204 may be used for various purposes, such as activating the illuminating components 210a, 210b, activating the imaging devices 212a, 212b, establishing a picocell and/or requesting the IMSI and/or IMSEI, and so on.

In one embodiment, upon the mobile device 202 being positioned with the drawer 204 and the drawer 204 being in a closed position, the processor(s) 216 may initiate an electronic scan or "sniffing" of the mobile device 202. The electronic scan may be used to determine if the object placed within the drawer is indeed a mobile device. In this embodiment, upon determining that the object is a mobile device, the assessment of the mobile device may begin. If it is determined that the object is not a mobile device, the actuator 214 may be activated to open the drawer 204 and an individual may again be instructed to place a mobile device within the drawer 204, for example.

The "sniffing" of the mobile device may be performed in various different ways, in different embodiments. In one embodiment, for example, the wireless transceiver 208 receives a signal emitted by the mobile device 202, digitizes the signal (e.g., with an analog-to-digital converter), and then transforms the digitized signal to the frequency domain (e.g., using a Fast Fourier Transform (FFT)). The processor(s) 216, or another processor (e.g., a processor within the wireless transceiver 208), may then process the frequency domain signal to detect its "signature." For example, the processor(s) 216 may detect the peaks of the harmonics or frequency slots that the mobile device 202 uses for communication. The processor(s) 216 may then compare known communication frequencies with those detected during the "sniffing" time period. If the frequencies match (or at least one frequency matches, etc.), the mobile device 202 may be identified as an "actual" mobile device.

In another example embodiment, the "sniffing" includes initiating a communication link (between the wireless transceiver 208 and the mobile device 202) by causing the wireless transceiver 208 to emit suitable GSM signals at frequencies that are selected from among all of the frequencies at which a GSM mobile device is able to communicate. If the mobile device 202 starts a handshake process on at least one of the selected frequencies, the mobile device 202 may be identified as an actual mobile device.

Figure 3:
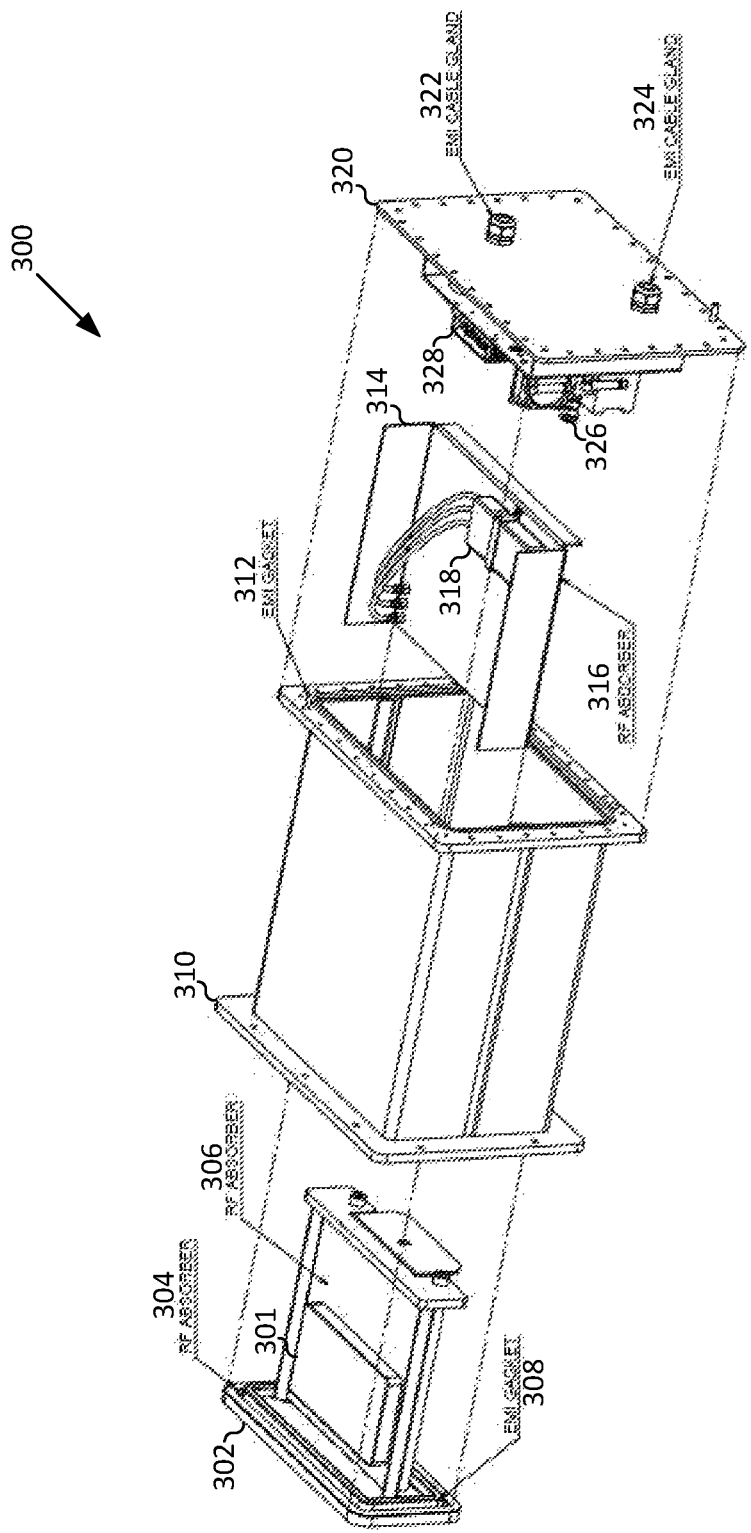
FIG. 3 depicts an exploded view of another example housing that may be used in the example system of FIG. 1, according to an embodiment of the present disclosure.

FIG. 3 depicts an exploded view of another example housing 300, according to an embodiment. The housing 300 may be used as the housing 116 of FIG. 1, for example. The housing 300 includes a drawer 302, a frame 310, an upper shelf 314, and a back face 320. The drawer 302 is configured to connect with the frame 310. The frame 310 is configured to connect with the back face 320. Upon connection of the drawer 302, the frame 310, and the back face 320, a faraday cage will be formed by the housing 300 (so long as the drawer 302 is closed). The drawer 302, the frame 310 and/or the back face 320 may be formed of an aluminum alloy, or another material suitable for attenuating RF signals. The upper shelf 314 is configured to be coupled within the frame 310 such that the upper shelf 314 is positioned above the drawer 302 when the drawer 302 is closed.

As shown in FIG. 3, the drawer 302 is configured to receive a mobile device 301 when the drawer 302 is open. The drawer 302 may include an RF absorber 304, an RF absorber 306 and an EMI gasket 308. The placement of the RF absorber 304 and the RF absorber 306 in the interior of the drawer 302 may help to attenuate RF signals within the faraday cage. The RF absorber 304 may have a thickness of about 0.5 mm and the RF absorber 306 may have a thickness of about 1 mm, for example. In other embodiments, more or fewer RF absorbers are used than are shown in FIG. 3, and/or the RF absorbers 304 and/or 306 are positioned differently on the drawer 302. The RF absorbers 304 and/or 306 may comprise a polymer resin with a metal flake filler, and/or a type of adhesive material such as acrylic non-conductive pressure-sensitive adhesive, for example.

The EMI gasket 308 may help to attenuate RF signals entering or exiting the faraday cage by contacting the two mating surfaces of the drawer 302 and the frame 310, and sealing small gaps between those two surfaces. To this end, the EMI gasket 308 may be formed of a material that can deform to fill gaps between the two mating surfaces. The EMI gasket 308 may contain a core comprising a foam material, such as high-grade polyurethane, for example. The core material may be covered with a highly conductive metalized fabric.

As shown in FIG. 3, the frame 310 may include an EMI gasket 312. The EMI gasket 312 may help to attenuate RF signals entering or exiting the faraday cage by contacting the two mating surfaces of the frame 310 and the back face 320, and sealing small gaps between those two surfaces. The EMI gasket 312 may be formed from the same material as the EMI gasket 308, for example.

The upper shelf 314 may include an additional RF absorber 316 (e.g., similar to RF absorber 304 or 306), and may also serve to hold in place (above drawer 302) an RF noise generator 318. In one embodiment, the RF noise generator 318 helps to ensure that the mobile device 301 does not join a cell external to the housing 300, by generating a wideband noise signal within the faraday cage formed by housing 300. The wideband noise may serve as "active cancellation" of sufficiently low-power signals (e.g., below approximately −90 dBm) that managed to get past the metal surfaces, EMI gaskets and RF absorbers, and/or entered via cables. The wireless transceiver 208 may transmit at a power level sufficient (given the very short range) to avoid significant degradation from the wideband noise. For example, the wireless transceiver 208 may transmit RF signals having a signal to noise ratio (SNR) of 40 dB or greater.

As shown in FIG. 3, the back face 320 may include EMI cable glands 322 and 324, a limit switch with spring actuator 326, and a processor 328. The back face 320 may be coupled to the frame 310 by a plurality of fasteners that are placed at short distances (e.g., 2 to 3 cm) from each other in order to minimize the distance between the back face 320 and the frame 310.

In one embodiment, the EMI glands 322 and 324 may be used to provide RF insulation and strain relief to one or more cables associated with various components within the faraday cage (e.g., to provide power, control, data, etc.). The EMI glands 322 and 324 help to prevent/attenuate RF signals from entering or exiting the faraday cage of housing 300 via the cables. The EMI glands 322 and/or 324 may comprise a metallic body (e.g., stainless steel) that includes wire mesh. Moreover, the EMI glands 322 and/or 324 may have a screw shape in order to tighten and exert pressure when connected, thereby allowing the wire mesh to make secure contact around the external conductive area of the cable (e.g., along the entire circumference or substantially the entire circumference).

The limit switch with spring actuator 326 may be configured to move the drawer 302 from a closed position to an open position, and/or vice versa. The limit switch with spring actuator 326 may be communicatively coupled with the processor 328. For example, a command from the processor 328 may cause an electrical current to flow and generate a magnetic field that keeps the drawer 302 in the closed position. A different command from the processor 328 may cause the electrical current to stop flowing, thereby reducing or eliminating the magnetic field and allowing the spring of the actuator 326 to decompress and push the drawer 302 to an open position. In such an embodiment, the user may need to push the drawer 302 closed after placing the mobile device 301 in the drawer 302.

The processor 328 may include a single processor or a set of more processors, and may be configured to perform other operations besides (or in addition to) controlling the state of the drawer 302. For example, the processor 328 may be similar to the processor(s) 216 of FIG. 2, discussed above. The processor 328 may also be coupled to the RF noise generator 318, and may activate the RF noise generator 318 while the mobile device 301 is positioned within the drawer 302 and the drawer 302 is in a closed position.

Figure 4:
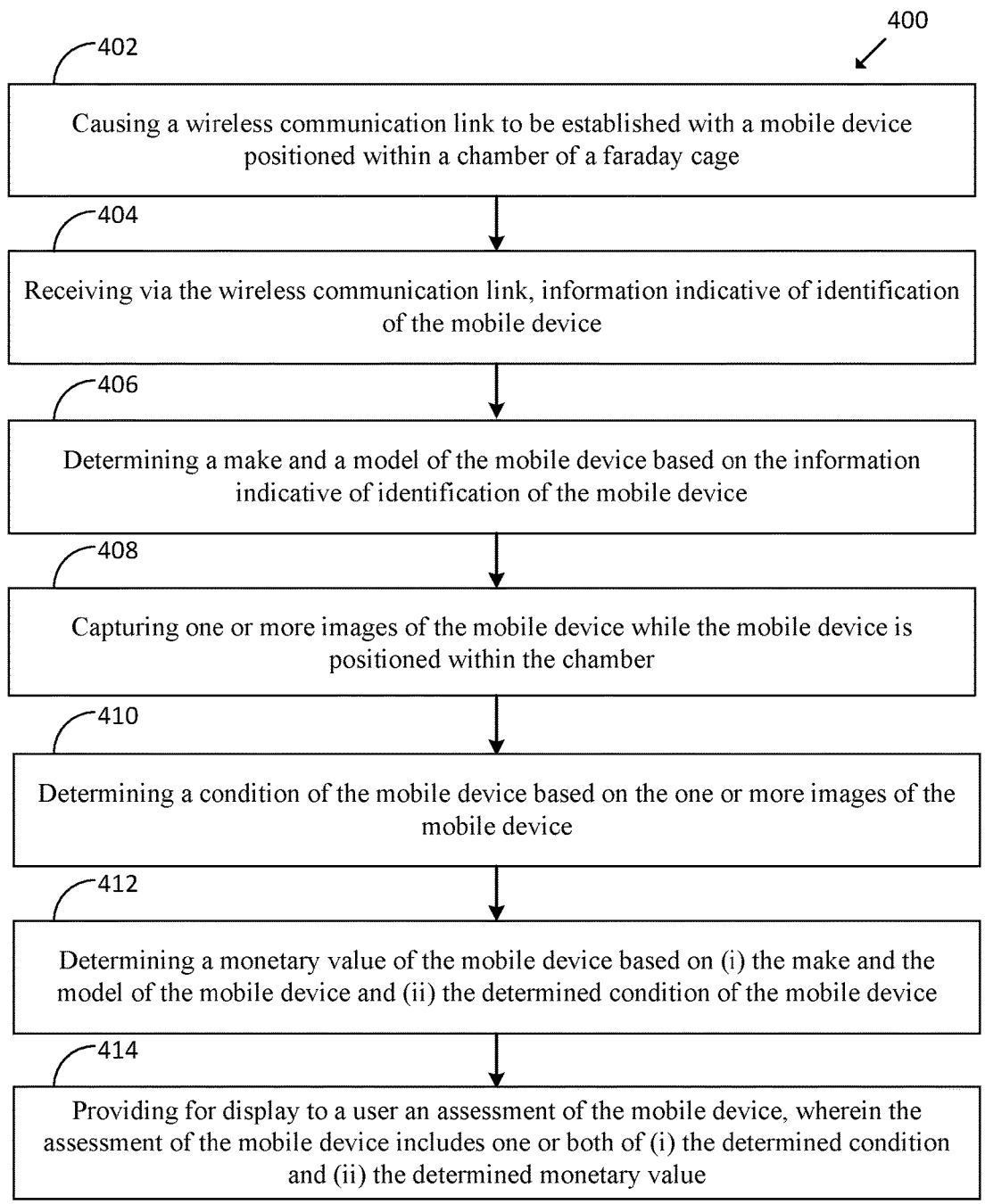
FIG. 4 depicts an example method for assessing a mobile device according to an embodiment of the present disclosure.
Figure 5:
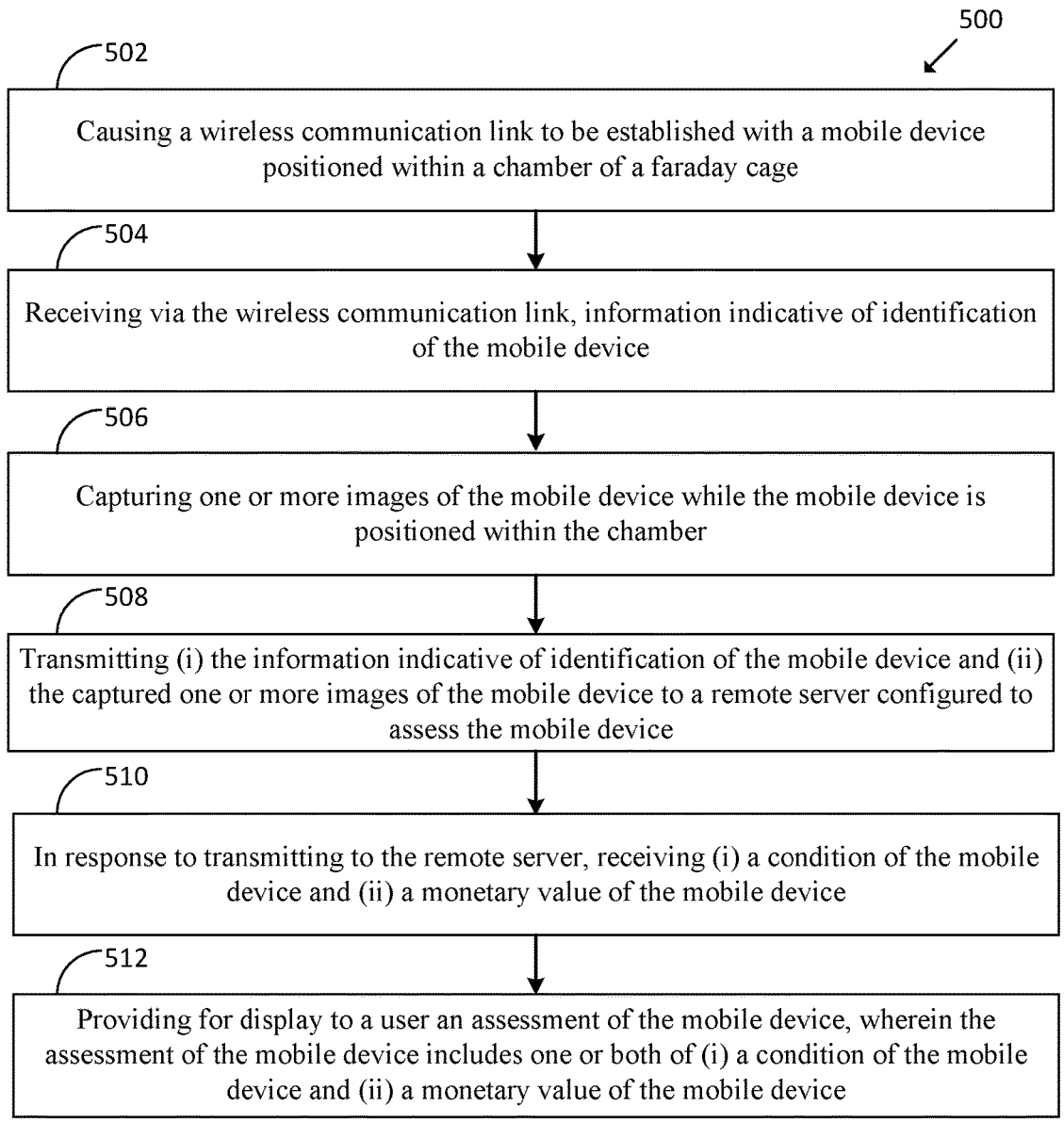
FIG. 5 depicts another example method for assessing a mobile device according to an embodiment of the present disclosure.

FIGS. 4 and 5 are flow diagrams of example methods for assessing a mobile device, each in accordance with at least some of the embodiments described herein. Although the blocks in each figure are illustrated in a sequential order, the blocks may in some instances be performed in parallel, and/or in a different order than those described therein. Also, the various blocks may be combined into fewer blocks, divided into additional blocks, and/or removed based upon the desired implementation.

In addition, the flowcharts of FIGS. 4 and 5 each show the functionality and operation of one possible implementation of the present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer-readable media that stores data for short periods of time, such as register memory, processor cache, or Random Access Memory (RAM), and/or persistent long term storage, such as read only memory (ROM), optical or magnetic disks, or compact-disc read only memory (CD-ROM), for example. The computer readable media may also be, or include, any other volatile or non-volatile storage systems. The computer readable medium may be considered a computer readable storage medium, a tangible storage device, or other article of manufacture, for example.

Alternatively, each block in FIG. 4 or FIG. 5 may represent circuitry that is wired to perform the specific logical functions in the process. Illustrative methods, such as those shown in FIGS. 4 and 5, may be carried out in whole or in part by a component or components in the cloud and/or system. However, it should be understood that the example methods may instead be carried out by other entities or combinations of entities (i.e., by other computing devices and/or combinations of computing devices), without departing from the scope of the invention. For example, functions of the method of FIG. 4 or FIG. 5 may be fully performed by a computing device (or components of a computing device such as one or more processors), or may be distributed across multiple components of the computing device, across multiple computing devices, and/or across a server.

Referring first to FIG. 4, an example method 400 for assessing a mobile device may include one or more operations, functions, or actions as illustrated by blocks 402-414. In one embodiment, the method 400 is implemented in whole or in part by the assessment apparatus 104 of FIG. 1 (or one or more processors thereof), the processor(s) 216 of FIG. 2, or the processor 328 of FIG. 3.

As shown by block 402, the method 400 includes causing a wireless communication link to be established with a mobile device positioned within a chamber of a faraday cage. Block 402 may include broadcasting cellular information via one or more antennas at least partially disposed within the chamber (e.g., antennas 206a and 206b of FIG. 2). In one embodiment, the mobile device may be configured to search for one or more signals (e.g., beacons) in order to establish a wireless communication link once the mobile device is within the faraday cage. Due to the attenuation of RF signals entering and exiting the chamber, the mobile device may only detect signals from the antenna(s) within the chamber, and thereby establish the wireless communication link rather than another, external link (e.g., to an external base station of another cell).

As shown by block 404, the method 400 also includes receiving, via the wireless communication link, information indicative of identification of the mobile device. In one embodiment, the information indicative of identification includes an IMSEI of the mobile device. Alternatively, or in addition, the information indicative of identification may include an IMSI of the mobile device.

As shown by block 406, the method 400 also includes determining a make and a model of the mobile device based on the information indicative of identification of the mobile device. This may include accessing one or more local databases associated with IMSEIs and/or IMSIs, for example. For instance, block 406 may include searching the one or more databases for a match of the determined IMSEI and/or IMSI and, upon finding a matching record or records within the database(s), determining the make and the model of the mobile device.

As shown by block 408, the method 400 also includes capturing one or more images of the mobile device while the mobile device is positioned within the chamber. For example, the image(s) may include a front side and a rear side of the mobile device. In one embodiment, the image(s) may be captured by imaging devices such as imaging devices 212a and 212b of FIG. 2, and components such as the illuminating components 210a and 210b of FIG. 2 may be used to provide illumination of the mobile device while the one or more images are captured.

As shown by block 410, the method 400 also includes determining a condition of the mobile device based on the one or more images of the mobile device. The condition may comprise a text description of damage to the device (e.g., "scratch on screen") and/or an overall score or grade (e.g., "good," "fair," "poor," "77/100," etc.), for example. The condition may be determined using any suitable image processing techniques. In alternative embodiments, block 410 includes receiving input from a human reviewer after displaying the captured image(s) of the mobile device to the reviewer.

In an embodiment, determining the condition includes receiving information indicative of a stock image of a mobile device of the same type as the mobile device being assessed. The correct stock image may be identified based on the make and model determined at block 406, for example. The information indicative of the stock image may be compared to the captured image(s) of the mobile device, and the condition of the mobile device may be determined based on the comparison.

Block 410 may also, or instead, include determining the condition of the mobile device based on one or more physical characteristics of the mobile device using image processing of both the information indicative of the stock image and the captured one or more images of the mobile device. The one or more physical characteristics may reflect physical damage to one or more external sides of the mobile device.

As shown by block 412, the method 400 also includes determining a monetary value of the mobile device based on (i) the make and the model of the mobile device and (ii) the determined condition of the mobile device. A database of monetary values for different makes, models and conditions may be stored locally, for example, and periodically updated (e.g., using an Internet connection) as needed. In other embodiments, block 412 includes sending the make, model and condition to a remote server, and receiving the monetary value from the remote server in response.

As shown by block 414, the method 400 also includes providing for display to a user an assessment of the mobile device, where the assessment of the mobile device includes the determined condition and/or the determined monetary value. In one embodiment, the user may choose to accept a transaction based on the assessment by selecting a virtual control on the display, or by actuating a physical control. As one example scenario, the user may agree to exchange his or her mobile device for an $80 discount on a newer version of the mobile device, or for a $5/month discount on a new service plan, etc. The method 400 may further include printing a receipt showing acceptance or execution of the transaction. Alternatively, the user may not be provided with an option to accept or reject a transaction. For example, the assessment may only be displayed on a user interface, and an attendant (e.g., at a retail store with a kiosk implementing the method 400) may observe the display and set up a transaction in accordance with the displayed information. As another example, the method 400 may include providing a report comprising the determined monetary value, and possibly one or more other information elements (e.g., the make and the model of the mobile device, the determined condition of the mobile device, etc.), and the user of the mobile device may show the report to an attendant if desired.

Referring next to FIG. 5, the example method 500 may include one or more operations, functions, or actions as illustrated by blocks 502-512. In one embodiment, the method 500 is implemented in whole or in part by the assessment apparatus 104 of FIG. 1 (or one or more processors thereof), the processor(s) 216 of FIG. 2, or the processor 328 of FIG. 3.

As shown by block 502, the method 500 includes causing a wireless communication link to be established with a mobile device positioned within a chamber of a faraday cage. Block 502 may be similar in functionality to block 402 of method 400.

As shown by block 504, the method 500 also includes receiving, via the wireless communication link, information indicative of identification of the mobile device (e.g., IMSEI and/or IMSI). Block 504 may be similar in functionality to block 404 of method 400.

As shown by block 506, the method 500 also includes capturing one or more images of the mobile device while the mobile device is positioned within the chamber. Block 506 may be similar in functionality to block 408 of method 400.

As shown by block 508, the method 500 also includes transmitting the information indicative of identification of the mobile device, and the captured one or more images of the mobile device, to a remote server configured to assess the mobile device (e.g., remote server 112 of FIG. 1). The information and images may be sent via a network such as communications network 108 of FIG. 1, for example. In one embodiment, the remote server may include a remote user interface that allows an individual to review the captured one or more images of the mobile device (and possibly the information indicative of identification of the mobile device) in order to assess the mobile device.

As shown by block 510, the method 500 also includes, in response to transmitting to the remote server, receiving a condition of the mobile device and a monetary value of the mobile device. In one scenario, the monetary value of the mobile device may also be provided with a qualifier, such as a period of time that the monetary value is valid.

As shown by block 512, the method 500 also includes providing for display to a user an assessment of the mobile device, where the assessment of the mobile device includes the condition of the mobile device and/or the monetary value of the mobile device. Block 512 may be similar in functionality to block 414 of method 400.

Figure 6:
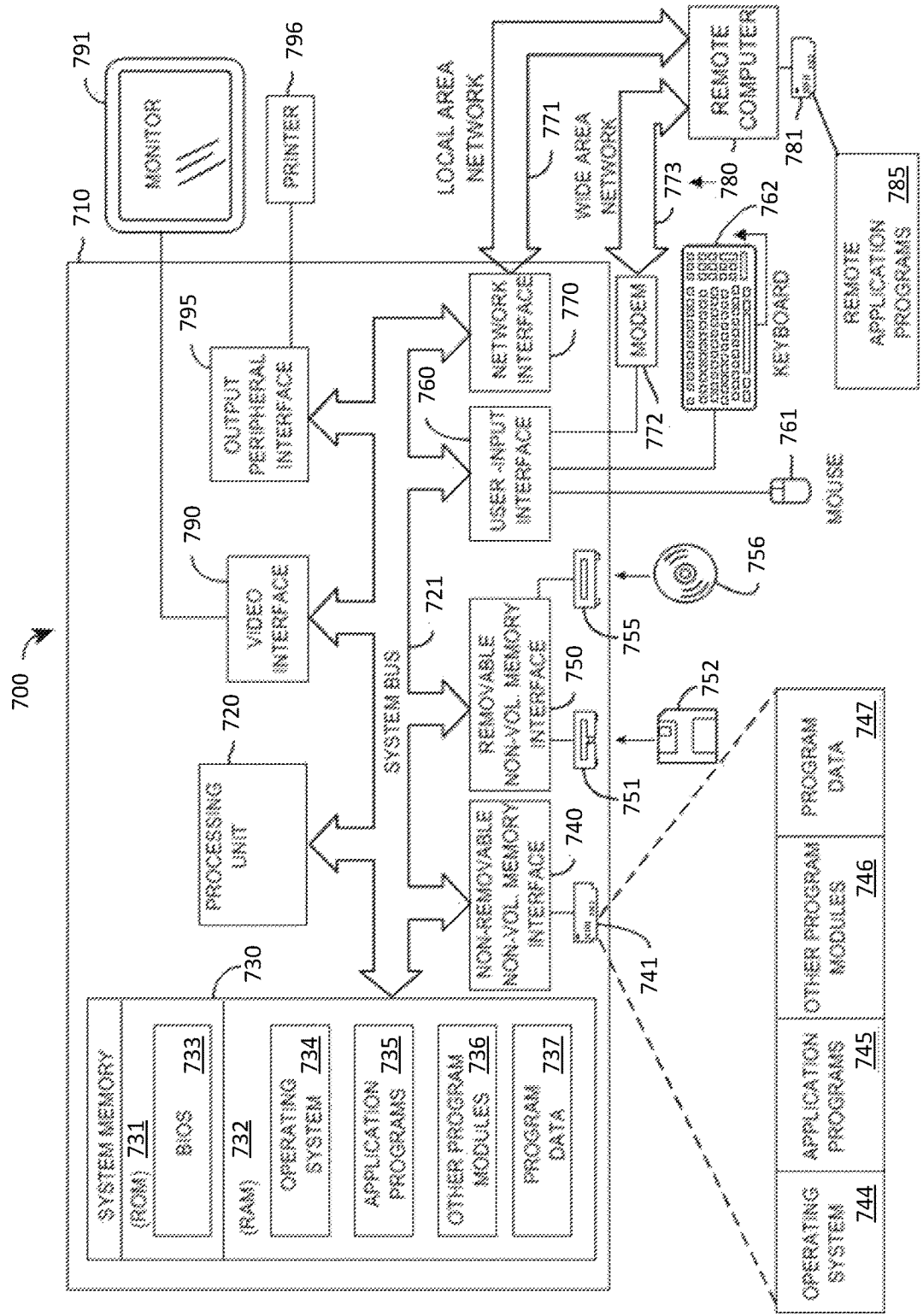
FIG. 6 is a block diagram of an example computer system in which the described embodiments may be implemented.

FIG. 6 is a block diagram of an example system 700 that may operate in accordance with the described embodiments. The system 700 of FIG. 6 includes a computing device in the form of a computer 710. Components of the computer 710 may include, and are not limited to, a processing unit 720, a system memory 730, and a system bus 721 that couples various system components including the system memory to the processing unit 720. The system bus 721 may be any of several types of bus structures including a memory bus or memory controller, a peripheral bus, and a local bus using any of a variety of bus architectures. By way of example, and not limitation, such architectures include the Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

The computer 710 typically includes a variety of computer readable media. Computer readable media can be any available media that can be accessed by computer 710 and includes both volatile and nonvolatile media, and both removable and non-removable media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, FLASH memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computer 710. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above are also included within the scope of computer readable media.

The system memory 730 includes computer storage media in the form of volatile and/or nonvolatile memory such as read only memory (ROM) 731 and random access memory (RAM) 732. A basic input/output system 733 (BIOS), containing the basic routines that help to transfer information between elements within computer 710, such as during start-up, is typically stored in ROM 731. RAM 732 typically contains data and/or program modules or routines, e.g., analyzing, calculating, indicating, etc., that are immediately accessible to and/or presently being operated on by processing unit 720. By way of example, and not limitation, FIG. 6 illustrates operating system 734, application programs 735, other program modules 736, and program data 737.

The computer 710 may also include other removable/non-removable, volatile/nonvolatile computer storage media. By way of example only, FIG. 6 illustrates a hard disk drive 741 that reads from or writes to non-removable, nonvolatile magnetic media, a magnetic disk drive 751 that reads from or writes to a removable, nonvolatile magnetic disk 752, and an optical disk drive 755 that reads from or writes to a removable, nonvolatile optical disk 756 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 741 is typically connected to the system bus 721 through a non-removable memory interface such as interface 740, and magnetic disk drive 751 and optical disk drive 755 are typically connected to the system bus 721 by a removable memory interface, such as interface 750.

The drives and their associated computer storage media discussed above and illustrated in FIG. 6 provide storage of computer readable instructions, data structures, program modules and other data for the computer 710. In FIG. 6, for example, hard disk drive 741 is illustrated as storing operating system 744, application programs 745, other program modules 746, and program data 747. Note that these components can either be the same as or different from operating system 734, application programs 735, other program modules 736, and program data 737. Operating system 744, application programs 745, other program modules 746, and program data 747 are given different numbers here to illustrate that, at a minimum, they are different copies. A user may enter commands and information into the computer 710 through input devices such as a keyboard 762 and cursor control device 761, commonly referred to as a mouse, trackball or touch pad. A screen 791 or other type of display device is also connected to the system bus 721 via an interface, such as a graphics controller 790. In addition to the screen 791, computers may also include other peripheral output devices such as printer 796, which may be connected through an output peripheral interface 795.

The computer 710 may operate in a networked environment using logical connections to one or more remote computers, such as a remote computer 780. The remote computer 780 may transmit and receive data from the assessment apparatus 104 of FIG. 1. The logical connections depicted in FIG. 6 include a local area network (LAN) 771 and a wide area network (WAN) 773, but may also include other networks. Such networking environments are commonplace in offices, enterprise-wide computer networks, intranets, and the Internet.

When used in a LAN networking environment, the computer 710 is connected to the LAN 771 through a network interface or adapter 770. When used in a WAN networking environment, the computer 710 typically includes a modem 772 or other means for establishing communications over the WAN 773, such as the Internet. The modem 772, which may be internal or external, may be connected to the system bus 721 via the input interface 760, or other appropriate mechanism. In a networked environment, program modules depicted relative to the computer 710, or portions thereof, may be stored in the remote memory storage device 781. By way of example, and not limitation, FIG. 6 illustrates remote application programs 785 as residing on memory device 781.

The communications connections 770, 772 allow the device to communicate with other devices. The communications connections 770, 772 are an example of communication media. The communication media typically embodies computer readable instructions, data structures, program modules or other data in a modulated data signal such as a carrier wave or other transport mechanism and includes any information delivery media. A "modulated data signal" may be a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Computer readable media may include both storage media and communication media.

The embodiments for the methods for assessing a mobile device as described above may be implemented in part or in their entirety using one or more computer systems such as the computer system 700 illustrated in FIG. 6. The information indicative of identification of a mobile device and the captured one or more images of the mobile device may be received by a computer such as the computer 710, for example. The information indicative of identification of a mobile device and the captured one or more images of the mobile device may be received from remote computer 780 over a communication medium such as local area network 771 or wide area network 773, via network interface 770 or user-input interface 760, for example. In such an embodiment, the remote computer 780 may represent the processors of the assessment apparatus 104 of FIG. 1.

Some or all of the steps in performing an assessment based on the information indicative of identification of a mobile device and the captured one or more images of the mobile device may be performed by a computer such as the computer 710, and more specifically may be performed by one or more processors, such as the processing unit 720, for example. In some embodiments, some portions of the assessment may be performed by a first computer such as the computer 710 while other portions of the assessment may be performed by one or more other computers such as the remote computer 780. The analyses and/or calculations associated with the assessment of the mobile device may be performed according to instructions that are part of a program such as the application programs 735, the application programs 745 and/or the remote application programs 785, for example. For example, the method 400 or the method 500 may be performed by the processing unit 720 when executing instructions stored in RAM 732.

In some embodiments, performing the assessment of the mobile device may include sending data over a network such as the local area network 771 or the wide area network 773 to another computer, such as the remote computer 781. In other embodiments, performing the assessment of the mobile device may include sending data over a video interface such as the video interface 790 to display information for assessing the mobile device on an output device such as the screen 791, for example.

Figure 7:
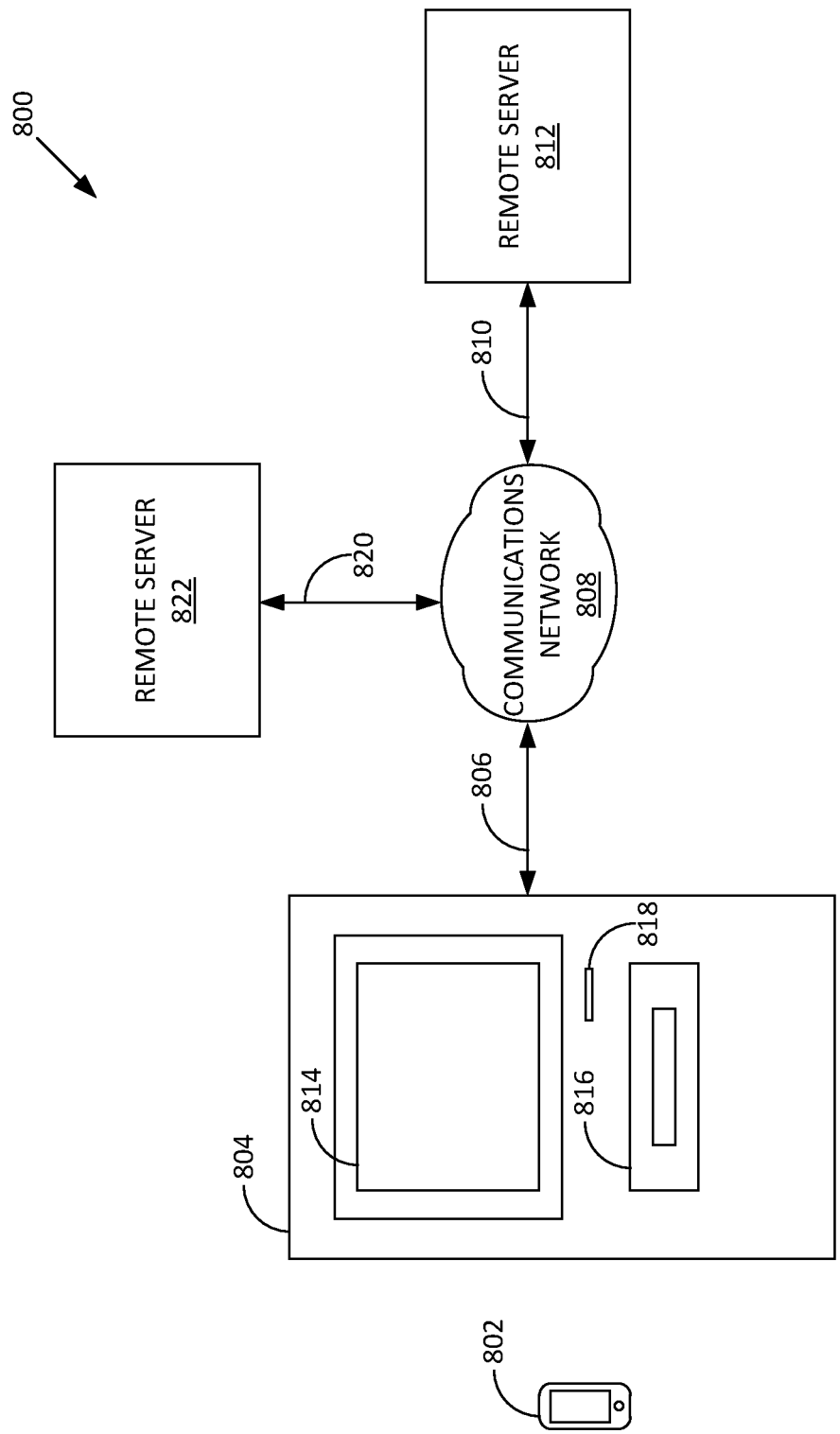
FIG. 7 is a block diagram of an example system in which an account associated with a mobile device may be "topped up" (pre-paid), according to an embodiment of the present disclosure.

FIG. 7 is a diagram of an example system 800 in which a mobile device account associated with a mobile device 802 may be "topped up" (pre-paid), according to one embodiment. Whereas conventional top up systems require a mobile device user to present a pre-paid top up card, and possibly personal or identification information such as telephone number, the system 800 may enable a user of the mobile device 802 to top up his or her mobile device account without necessarily using a top up card, and/or without necessarily providing a telephone number or any other personal or identification information, thereby avoiding major inconveniences traditionally associated with top up systems.

The mobile device 802 may be a smartphone or other mobile telephone capable of cellular communication, for example. Alternatively, in some embodiments, the mobile device 802 may be a tablet device, or another device capable of communicating via a cellular network. In addition to the mobile device 802, the system 800 includes a top up apparatus 804, a communications network 808, a remote server 812 and another remote server 822. The top up apparatus 804, the remote server 812 and the remote server 822 may communicate via the communications network 808 and the communication channels 806, 810, and 820, as shown in FIG. 7.

The top up apparatus 804 may be a kiosk, for example. Within the top up apparatus 804 is a display 814, an internal housing 816, and a payment acceptor 818. The top up apparatus 804 may also include one or more processors (not shown in FIG. 7) that execute software instructions (stored in a persistent memory not shown in FIG. 7) to enable the various operations and functions of the top up apparatus 804 as described below. The display 814 may be a touch screen or, alternatively, the top up apparatus 804 may include a keyboard or other user input mechanism (not shown in FIG. 7). For ease of explanation, however, the discussion below refers to embodiments in which the display 814 is a touch screen.

The housing 816 may include a faraday cage that includes or defines a chamber having an ingress mechanism. The ingress mechanism may be configured to enable a user to position the mobile device 802 within the chamber. In one example, the ingress mechanism may comprise a moveable drawer configured to move between an open position and a closed position. The moveable drawer may be configured to receive the mobile device 802 when in the open position. In various embodiments, the housing 816 may be the same as or similar to the housing 116 of FIG. 1, the housing 200 of FIG. 2, or the housing 300 of FIG. 3, described above.

The payment acceptor 818 includes hardware, with associated firmware and/or software (stored in a memory internal to the top up apparatus 804 and not shown in FIG. 7), that may be configured to receive and recognize a payment for a mobile device account associated with the mobile device 802. In various embodiments, the payment acceptor 818 may be configured to receive and recognize payments in the form of paper currency, coins and/or printed vouchers. In one embodiment, the payment acceptor 818 is configured to transmit the payment amount to one or more processors of the top up apparatus 804 (e.g., processor(s) 216 of FIG. 2) upon recognizing/detecting the payment amount.

Alternatively, or additionally, the payment acceptor 818 may be configured to receive and recognize payments via credit cards and/or debit cards. In such an embodiment, the payment acceptor 818 may be configured to receive payment via a magnetic stripe reader. In other embodiments, the payment acceptor 818 may include a near field communication (NFC) reader, and may be configured to receive payments without directly contacting or accepting any currency or cards. In other embodiments, the payment acceptor 818 may also, or instead, receive wireless payment from a credit card and/or debit card using other suitable techniques.

The top up apparatus 804 may include a wireless transceiver and one or more antennas (neither shown in FIG. 7) for communicating with the mobile device 802 when the mobile device 802 is positioned within the chamber. The wireless transceiver and antenna(s) may be configured and/or operate as discussed above in connection with FIG. 1 or 2, for example. For instance, the top up apparatus 804 may configure the wireless transceiver (and possibly other processors/circuitry within the top up apparatus 804) as a base station to support an active cell of a cellular communication network (e.g., a picocell, a femtocell, etc.), and the wireless transceiver may support one or more cellular technologies (e.g., 2G, 3G, 4G, etc.). When the mobile device 802 is positioned within the chamber, the mobile device can then connect to the cell (e.g., in a roaming mode), and exchange information with the top up apparatus 804. In some alternative embodiments, the wireless communication link established with the mobile device 802 may utilize other, non-cellular technologies. For ease of explanation, however, the discussion below primarily refers to an embodiment in which a cellular communication technology is used.

In one embodiment, the top up apparatus 804 activates the cell (e.g., starts sending out beacons, etc.) in response to detecting a user input at the touchscreen of display 814. In another embodiment, the top up apparatus 804 activates the cell in response to detecting that the drawer or other ingress mechanism of the housing 816 is closed while a mobile device (e.g., mobile device 802) is present in the chamber, or in response to another suitable trigger. The closed state of the ingress mechanism may be detected by a sensor such as a Hall effect sensor, and the presence of a mobile device may be detected by a weight or pressure sensor, for example.

The top up apparatus 804 may request the IMSEI and/or IMSI of the mobile device 802, and receive the IMSEI and/or IMSI in response, via the established cellular link. The IMSEI and/or IMSI may be used to identify the mobile account with which the mobile device 802 is associated, and/or to determine other information about the mobile device 802 and/or the user of the mobile device 802, as discussed further below. In other embodiments, other information indicative of the identity (other than IMSEI/IMSI) of the mobile device 802 may also, or instead, be obtained by the top up apparatus 804 via the cellular link. For ease of explanation, however, the description below refers primarily to IMSEI and IMSI.

As shown in FIG. 7, the top up apparatus 804 may be in operative communication with the remote server 812 and the remote server 822 via the communications network 808 and the communication channels 806, 810, and 820. The remote server 812 may generally store and maintain account information for a number of mobile devices, including mobile device 802. The remote server 822 may generally handle payments/transactions and other accounting functions associated with the mobile device accounts. In one embodiment, the remote server 812 and the remote server 822 may be configured as one remote server. In another embodiment, the remote server 812 comprises a plurality of servers, and/or the remote server 822 comprises a plurality of servers. The servers 812 and 822 may both be associated with a single entity (e.g., a telecommunications service provider), or may be associated with different entities.

Communication sent through communication channels 806, 810, and 820 and the communications network 808 may be encrypted or otherwise secured. In one example, the communications network 808 may include the Internet and one or more local Ethernet networks. Generally, the communications network 808 may include one or more wired and/or wireless networks, including local area and/or wide area networks.

In operation, the top up apparatus 804 may send the IMSI and/or IMSEI collected from the mobile device 802 to the remote server 812 via the communications network 808. The remote server 812 may then use the IMSI and/or IMSEI to identify the account associated with the mobile device 802. To identify the appropriate account, the remote server 812 may include one or more processors executing software instructions stored in a persistent memory of the remote server 812 (not shown in FIG. 7).

To identify the mobile device account, the remote server 812 may access one or more databases (not shown in FIG. 7) to retrieve information corresponding to the received IMSI and/or IMSEI. The remote server 812 (or another server not shown in FIG. 7) may also use the IMSI and/or IMSEI to determine other information associated with the mobile device 802, such as the service provider used by the mobile device 802 and/or the current balance of prepaid funds associated with the mobile device account, for example. Once the mobile device account is identified, the remote server 812 may transmit an identifier of the account (e.g., an account number) to the remote server 822 via the communications network 808. Alternatively, the remote server 812 may transmit the identifier of the account to the top up apparatus 804 via the communications network 808.

In some embodiments, after the user has inserted the mobile device 802 in the housing 816 via the ingress mechanism, a cellular link has been established, and the mobile device 802 has provided the IMSEI and/or IMSI, the user is prompted (e.g., via a message on display 814) to either enter a cash payment or make a credit or debit card payment via the payment acceptor 818. If a credit or debit card payment is made, the user may enter the desired payment amount using the touchscreen of the display 814, or using a dedicated user interface associated with the payment acceptor 818. In other embodiments, the user may make payment, and/or is prompted to make payment, at a different time (e.g., after the user presses a "start" button on display 814, even if the user has not yet inserted the mobile device 802 into the housing 816, etc.). Upon receipt of payment, the payment acceptor 818 may provide information indicative of the desired payment amount to one or more processors of the top up apparatus 804.

The top up apparatus 804 may then send the desired payment amount to remote server 822. If the remote server 812 returned the identifier of the mobile device account to the top up apparatus 804, the top up apparatus 804 may also send the account identifier to the remote server 822. Alternatively, the remote server 822 may learn/receive the account identifier directly from the remote server 812, or the servers 812 and 822 may be one and the same. In any of these embodiments, the remote server 822 may use the account identifier to access one or more databases (not shown in FIG. 7) to identify the mobile device account of the mobile device 802.

In some embodiments where the account identifier is sent from remote server 812 to top up apparatus 804, and then from top up apparatus 804 to remote server 822, the account identifier is not the true account number, but rather a pseudo-random or other temporary identifier established for security reasons. For example, the remote server 812 may assign a temporary identifier to the account, and inform (via a secure channel) the remote server 822 that the temporary identifier corresponds to that account. In this manner, the remote server 822 may recognize that any future messages from the top up apparatus 804 that include the temporary identifier apply to that account. In other embodiments, other suitable security measures may be used.

After the remote server 822 applies the desired payment amount to the appropriate mobile device account, the remote server 822 may transmit a message to the top up apparatus 804 verifying that the desired payment amount has been applied to the account. The top up apparatus 804 may then display the message, or a notification based on that message, to the user via display 814 to confirm to the user that the desired payment amount has been applied. Once the transaction is completed (or when the user presses a virtual "cancel" button on the touchscreen of display 814, etc.), the mobile device 802 may be released from the chamber of the housing 816 via the ingress mechanism (e.g., a drawer may automatically slide open). In other embodiments, the user must manually operate the ingress mechanism to remove mobile device 802.

Figure 8:
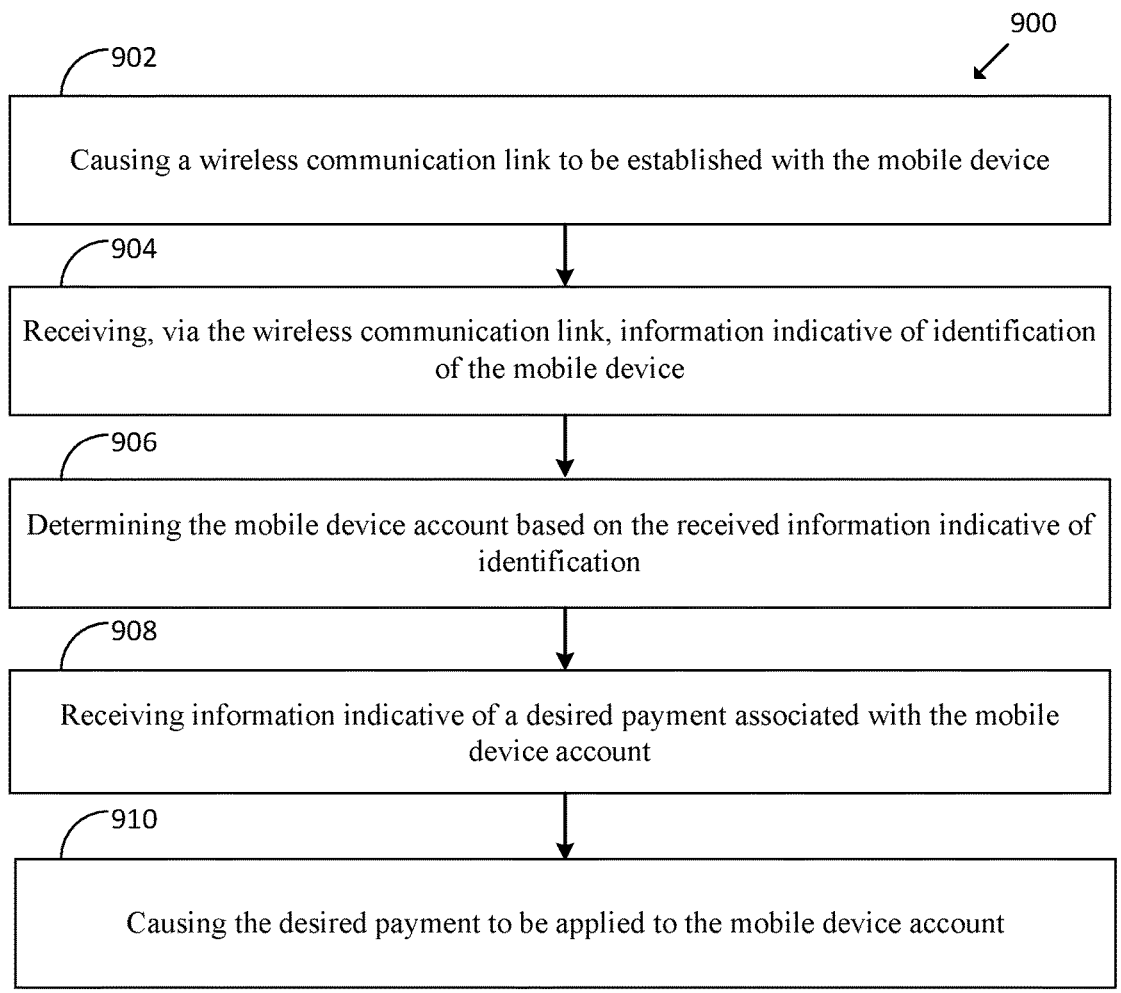
FIG. 8 depicts an example method for topping up an account associated with a mobile device, according to an embodiment of the present disclosure.

FIG. 8 is a flow diagram of an example method 900 for topping up a mobile device account of a mobile device, in accordance with at least some of the embodiments described herein. Although the blocks in each figure are illustrated in a sequential order, the blocks may in some instances be performed in parallel, and/or in a different order than those described therein. Also, the various blocks may be combined into fewer blocks, divided into additional blocks, and/or removed based upon the desired implementation.

In addition, the flowchart of FIG. 8 shows the functionality and operation of one possible implementation of the present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer-readable media that stores data for short periods of time, such as register memory, processor cache, or Random Access Memory (RAM), and/or persistent long term storage, such as read only memory (ROM), optical or magnetic disks, or compact-disc read only memory (CD-ROM), for example. The computer readable media may also be, or include, any other volatile or non-volatile storage systems. The computer readable medium may be considered a computer readable storage medium, a tangible storage device, or other article of manufacture, for example.

Alternatively, each block in FIG. 8 may represent circuitry that is wired to perform the specific logical functions in the process. Illustrative methods, such as those shown in FIG. 8, may be carried out in whole or in part by a component or components in the cloud and/or system. However, it should be understood that the example methods may instead be carried out by other entities or combinations of entities (i.e., by other computing devices and/or combinations of computing devices), without departing from the scope of the invention. For example, functions of the method of FIG. 8 may be fully performed by a computing device (or components of a computing device such as one or more processors), or may be distributed across multiple components of the computing device, across multiple computing devices, and/or across a server.

The example method 900 may include one or more operations, functions, or actions as illustrated by blocks 902-910. In one embodiment, the method 900 is implemented in whole or in part by the top up apparatus 804 of FIG. 7 (or one or more processors thereof), the processor(s) 216 of FIG. 2, or the processor 328 of FIG. 3.

As shown by block 902, the method 900 includes causing a wireless communication link (e.g., a cellular link) to be established with the mobile device (e.g., mobile device 802 of FIG. 7). In one embodiment, the wireless communication link may be established with the mobile device within a chamber of a faraday cage. Block 902 may include broadcasting cellular information via one or more antennas at least partially disposed within the chamber (e.g., antennas 206a and 206b of FIG. 2) of the faraday cage. In one embodiment, the mobile device may be configured to search for one or more signals (e.g., beacons) in order to establish a wireless communication link once the mobile device is within the faraday cage. Due to the attenuation of RF signals entering and exiting the chamber, the mobile device may only detect signals from the antenna(s) within the chamber, and thereby establish the wireless communication link rather than another, external link (e.g., to an external base station of another cell). The wireless communication link may be established in a manner similar to that discussed above in connection with FIG. 1 or FIG. 7, for example.

As shown by block 904, the method 900 also includes receiving, via the wireless communication link, information indicative of identification of the mobile device. In one embodiment, the information indicative of identification includes an IMSEI of the mobile device. Alternatively, or in addition, the information indicative of identification may include an IMSI of the mobile device.

As shown by block 906, the method 900 also includes determining the mobile device account of the mobile device based on the information indicative of identification of the mobile device. This may include sending the identifying information to a remote server (e.g., remote server 812 of FIG. 7) and, in response, receiving from the remote server an identifier of the mobile device account (e.g., as described above in connection with FIG. 7), for example. In some embodiments, block 906 is omitted, and the apparatus, processor(s), etc., implementing the method 900 does not determine or receive any identifier of the mobile device account.

As shown by block 908, the method 900 also includes receiving information indicative of a desired payment associated with the mobile device account. For example, a user of the mobile device may use a touchscreen (e.g., display of 814 of FIG. 7) to indicate a desired payment amount (e.g., $20, $50, etc.) for an inserted or swiped credit or debit card, or may simply insert (physically deposit) cash in the desired payment amount, and the block 908 may include detecting the amount so indicated or inserted. In one embodiment, block 908 may include comparing a payment amount that the user has indicated (e.g., via a touchscreen or keypad) to an amount of cash actually inserted, to verify that the payment is of the desired amount.

As shown by block 910, the method 900 also includes causing the desired payment to be applied to the mobile device account. The desired payment is caused to be applied to the account at least in part by sending the information indicative of identification of the mobile device (e.g., the IMSEI and/or IMSI) and the information indicative of the desired payment to one or more remote servers. In one embodiment, for example, the desired payment is caused to be applied to the account by sending both the information indicative of identification of the mobile device and the information indicative of the desired payment to a single remote server. In an alternative embodiment, the desired payment is caused to be applied to the account by sending the information indicative of identification of the mobile device to a first remote server of the one or more remote servers (e.g., remote server 812 of FIG. 7), receiving in response an account identifier associated with the mobile device account, and then sending both the information indicative of the desired payment and the account identifier to a second remote server of the one or more remote servers (e.g., remote server 822 of FIG. 7). In either case, the remote server(s) may use the received information to update/modify the mobile device account by applying the desired payment to the account. Applying the desired payment may include increasing a balance associated with the account, for example.

Referring back to FIG. 6, the application programs 745 may include instructions that when executed by processor(s) of system 700, cause the system 700 to top up a mobile device account of a mobile device in accordance with any of the embodiments described above in connection with FIG. 7 or FIG. 8. The instructions may be, for example, computer executable and/or logic implemented instructions included in program data 747. In another example, the instructions may be encoded on a computer readable storage media such as nonvolatile magnetic disk 752 and/or nonvolatile optical disk 756, as shown in FIG. 6.

Figure 9:
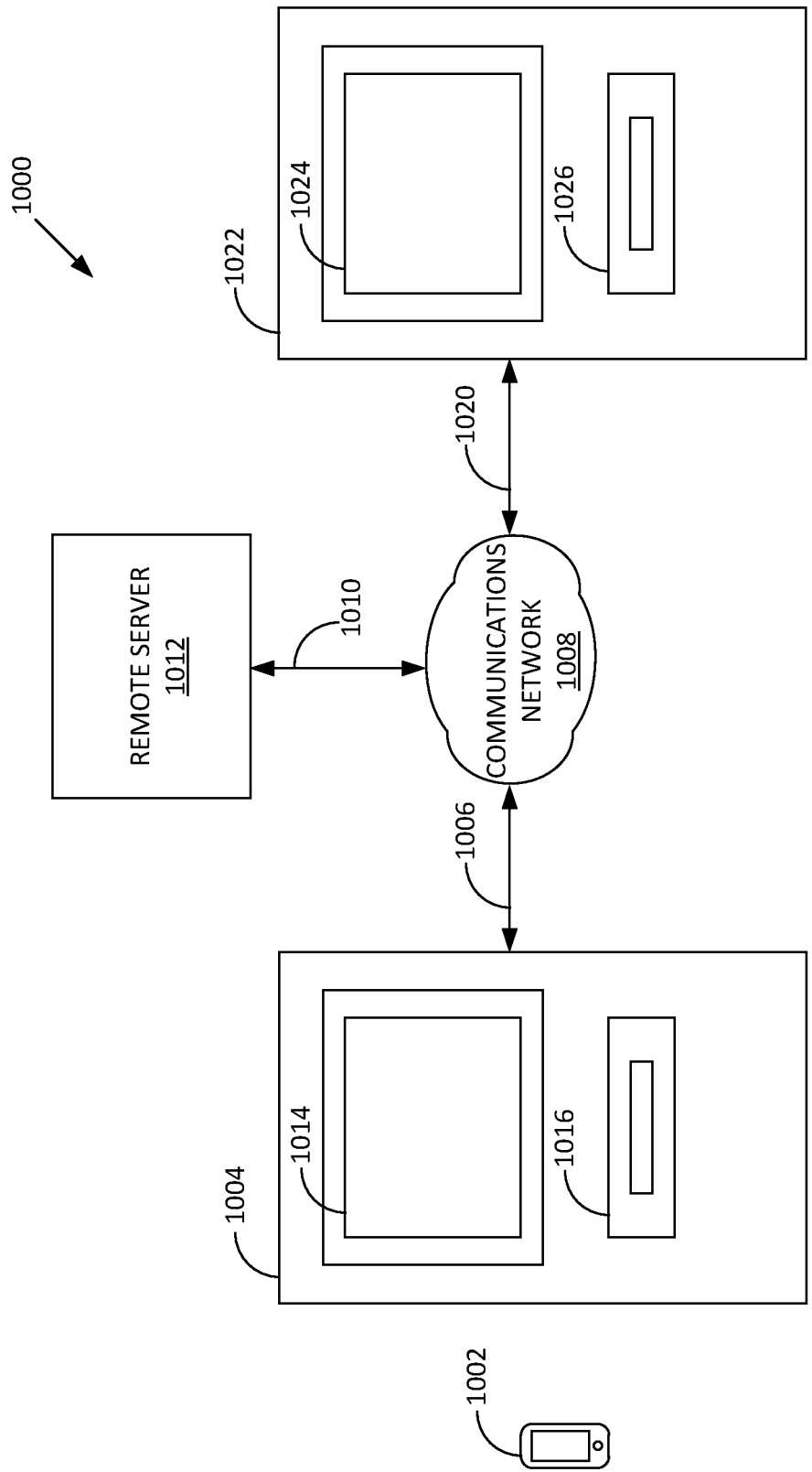
FIG. 9 is a block diagram of an example system in which a mobile device may be tracked or accounted for in order to facilitate recycling of the mobile device, according to an embodiment of the present disclosure.

FIG. 9 is a diagram of an example system 1000 in which a mobile device 1002 may be tracked or accounted for in order to facilitate recycling of the mobile device 1002, according to one embodiment. Some of the problems that arise in recycling mobile devices may be attributed to problems with the inbound flow (e.g., starting when the devices have been exchanged or deposited at a retail store, and continuing at least until the devices have been delivered to one or more warehouses or other stations). For example, conventional recycling processes and systems typically require individuals to manually obtain and record identification information from the mobile phones in order to initiate tracking of, or confirm receipt of, the mobile phones. In addition to generally being a slow process, this can lead to mistakes, such as the inaccurate recording of identification information.

By implementing certain aspects of the invention described herein, the system 1000 may overcome or mitigate these and/or other drawbacks of conventional processes and systems for recycling mobile devices. Generally, the system 1000 may be used to easily identify mobile devices, to accurately record identification information for each mobile device, and to generate or update a status for each mobile device. In this manner, the identity of each mobile device (and/or other information about the mobile device) may easily and accurately be determined or verified at one or more stages of a recycling process.

Referring to FIG. 9, the mobile device 1002 may be a smartphone or other mobile telephone capable of cellular communication, for example. Alternatively, in some embodiments, the mobile device 1002 may be a tablet or other device capable of communicating via a cellular network. In addition to the mobile device 1002, the system 1000 includes a mobile device assessment apparatus 1004, a communications network 1008, a remote server 1012 and another mobile device assessment apparatus 1022. The mobile device assessment apparatus 1004, the remote server 1012, and the mobile device assessment apparatus 1022 may communicate via the communications network 1008 and the communication channels 1006, 1010, and 1020, as shown in FIG. 9.

The mobile device assessment apparatus 1004 may be a kiosk within a retail store or other commercial building, for example. Within the mobile device assessment apparatus 1004 is a display 1014 and an internal housing 1016. The mobile device assessment apparatus 1004 may also include one or more processors (not shown in FIG. 9) that execute software instructions (stored in a persistent memory not shown in FIG. 9) to enable the various operations and functions of the mobile device assessment apparatus 1004 as described below. The display 1014 may be a touch screen or, alternatively, the mobile device assessment apparatus 1004 may include a keyboard or other user input mechanism (not shown in FIG. 9). For ease of explanation, however, the discussion below refers to embodiments in which the display 1014 is a touch screen.

The housing 1016 may include a faraday cage that includes or defines a chamber having an ingress mechanism. The ingress mechanism may be configured to enable a user to position the mobile device 1002 within the chamber. In one example, the ingress mechanism may comprise a moveable drawer configured to move between an open position and a closed position. The moveable drawer may be configured to receive the mobile device 1002 when in the open position. In various embodiments, the housing 1016 may be the same as or similar to the housing 116 of FIG. 1, the housing 200 of FIG. 2, or the housing 300 of FIG. 3, described above. For example, the housing 1016 may include a wireless transceiver and one or more antennas for communicating with a mobile device positioned within the chamber of housing 1016 (e.g., by establishing a picocell), may obtain the IMSEI and/or IMSI from the mobile device 1002 via the communication link, and so on. More generally, in some embodiments, the mobile device assessment apparatus 1004 may provide any of the functionality described above in connection with the assessment apparatus 104 of FIG. 1. For example, the mobile device assessment apparatus 1004 may, alone or in conjunction with a remote server, determine a make and model of the mobile device 1002 using an obtained IMSEI and/or IMSI, assess a physical condition of the mobile device 1002, present a monetary (e.g., trade in) value of the mobile device 1002, and so on.

As shown in FIG. 9, the mobile device assessment apparatus 1004 may be in operative communication with the remote server 1012 via the communications network 1008 and the communication channels 1006 and 1010. The remote server 1012 may generally store and maintain information for a number of mobile devices, as will be described further below in connection with a scenario involving mobile device 1002. In various embodiments, the remote server 1012 comprises a plurality of servers, or only a single server. The remote server 1012 may be associated with an entity that provides a mobile device tracking service, for example, or a different entity. In embodiments where the remote server includes multiple servers, the servers may be associated a single entity or with different entities. In some embodiments, the remote server 1012 also provides the functionality described in connection with remote server 112 of FIG. 1 (e.g., using an IMSEI and/or IMSI from mobile device assessment apparatus 1004 to determine make and model, using images from mobile device assessment apparatus 1004 to assess a physical condition, etc.). In other embodiments, the remote server 1012 only provides tracking functionality (e.g., storing and updating tracking records).

Communication sent through communication channels 1006, 1010, and 1020 and the communications network 1008 may be encrypted or otherwise secured. In one example, the communications network 1008 may include the Internet and one or more local Ethernet networks. Generally, the communications network 1008 may include one or more wired and/or wireless networks, including local area and/or wide area networks.

The mobile device assessment apparatus 1022 may be a kiosk within a warehouse or other building or station where mobile devices may be stored, refurbished and/or redistributed, for example. In an embodiment, the mobile device assessment apparatus 1004, the remote server 1012, and the mobile device assessment apparatus 1022 are all at different geographic locations. For example, the mobile device assessment apparatus 1004 may be located in a retail store in London, the remote server 1012 may be located in a data center in Rio de Janeiro, and the mobile device assessment apparatus 1022 may be located in a warehouse in Athens.

Within the mobile device assessment apparatus 1022 is a display 1024 and an internal housing 1026, which may be similar to the display 1014 and internal housing 1016, for example. The mobile device assessment apparatus 1022 may also include one or more processors (not shown in FIG. 9) that execute software instructions (stored in a persistent memory not shown in FIG. 9) to enable the various operations and functions of the mobile device assessment apparatus 1024 as described below. The mobile device assessment apparatus 1022 may be identical or nearly identical to the mobile device assessment apparatus 1004, or may have limited functionality as compared to the mobile device assessment apparatus 1004. For example, the mobile device assessment apparatus 1004 may support the tracking process described below and also be configured to facilitate assessment of the physical condition of mobile devices (e.g., as discussed above in connection with assessment apparatus 104 of FIG. 1), while the mobile device assessment apparatus 1022 may support the tracking process but not provide other assessment functions. The mobile device assessment apparatus 1022 may be in operative communication with the remote server 1012 via the communications network 1008 and the communication channels 1010 and 1020, similar to the operative communication between the mobile device assessment apparatus 1004 and the remote server 1012.

Operation of the system 1000 will now be described in connection with an example scenario in which the mobile device assessment apparatus 1004 is located in a retail store and the mobile device assessment apparatus 1022 is located in a warehouse. In this scenario and embodiment, a user associated with (e.g., an owner of) the mobile device 1002 may decide that he or she would like to exchange and/or recycle the mobile device 1002 in order to receive a credit towards a new mobile device and/or service plan associated with a telecommunications provider. The user may visit the retail store and place the mobile device 1002 in a drawer of the mobile device assessment apparatus 1004. The mobile device assessment apparatus 1004 may then assess the mobile device 1002, and present a monetary value to the user on the display 1014 (e.g., in accordance with the method 500 of FIG. 5). The user may then indicate acceptance of an offer that involves surrendering the mobile device 1002 in exchange for the discounted new mobile device. For example, the user may be prompted to accept or reject the offer, and may accept by pressing a "start" or "yes" button on display 1014.

In response to the user accepting the offer (or another suitable trigger), the mobile device assessment apparatus 1004 may send the IMSEI and/or IMSI collected from the mobile device 1002 in the form of a tracking report to the remote server 1012 via the communications network 1008. The remote server 1012 may then use the IMSEI and/or IMSI to create a tracking record associated with the mobile device 1002. To create the tracking record, the remote server 1012 may include one or more processors executing software instructions stored in a persistent memory of the remote server 1012 (not shown in FIG. 9). The tracking record may include the IMSEI and/or IMSI, a current status of the mobile device 1002, and possibly one or more other fields, for example. When the tracking record is first created, the status may initially be set to a default value, such as "Recycled." Alternatively, the initial status may depend on information included in the tracking report received from the mobile device assessment apparatus 1004. Various example tracking records are discussed in more detail below in connection with FIG. 10.

In one embodiment, after the mobile device 1002 has provided the IMSEI and/or IMSI and the offer has been accepted by the user, the mobile device 1002 may be automatically or manually placed into a repository/storage area associated with the mobile device assessment apparatus 1004 (e.g., as discussed above in connection with FIG. 1 and/or FIG. 2). The repository/storage area may be configured to store a plurality of mobile devices until an appropriate party (e.g., a shipping courier) picks up the mobile devices for delivery to the warehouse (or possibly multiple warehouses). In this embodiment, the mobile device assessment apparatus 1004 may be configured to transmit a second tracking report to the remote server 1012 once the plurality of mobile devices have been picked up for delivery (e.g., when the mobile device assessment apparatus 1004 detects that the repository is opened, or when a shipping courier employee provides an explicit confirmation of pick up via a button or other input shown on display 1014, etc.). For example, the second tracking report may include information indicative of the mobile device 1002 being in transit, along with the IMSEI and/or IMSI of the mobile device 1002 to allow the appropriate tracking record to be located. Upon receiving the second tracking report, the remote server 1012 may change the status field in the tracking report associated with mobile device 1002 from its initial value (e.g., "Recycled") to a value indicating transit (e.g., "In Transit"). In an alternative embodiment, the shipping courier uses a third mobile device assessment apparatus (not shown in FIG. 9), which is itself mobile, to transfer the mobile device 1002, and the third mobile device assessment apparatus sends the second tracking report to the remote server 1012. In other embodiments, the remote server 1012 is notified of the "in transit" status of the mobile device 1002 in another suitable manner.

In one embodiment and scenario, the tracked portion of the recycling process may be completed upon receipt of the mobile device 1002 at the warehouse that includes the mobile device assessment apparatus 1022. A user (e.g., an employee of an entity associated with the warehouse) may insert the mobile device 1002 in the housing 1026 via the ingress mechanism, a cellular link may be established, and the mobile device 1002 may then provide the IMSEI and/or IMSI to the mobile device assessment apparatus 1022. Thereafter, the mobile device assessment apparatus 1022 may transmit a third tracking report which includes the IMSEI and/or IMSI along with status information to the remote server 1012. The remote server 1012 may use the IMSEI and/or IMSI to again identify the tracking record associated with the mobile device 1002, and use the status information to update the status field to reflect completion of the process (e.g., update the status to "Complete").

Figure 10:
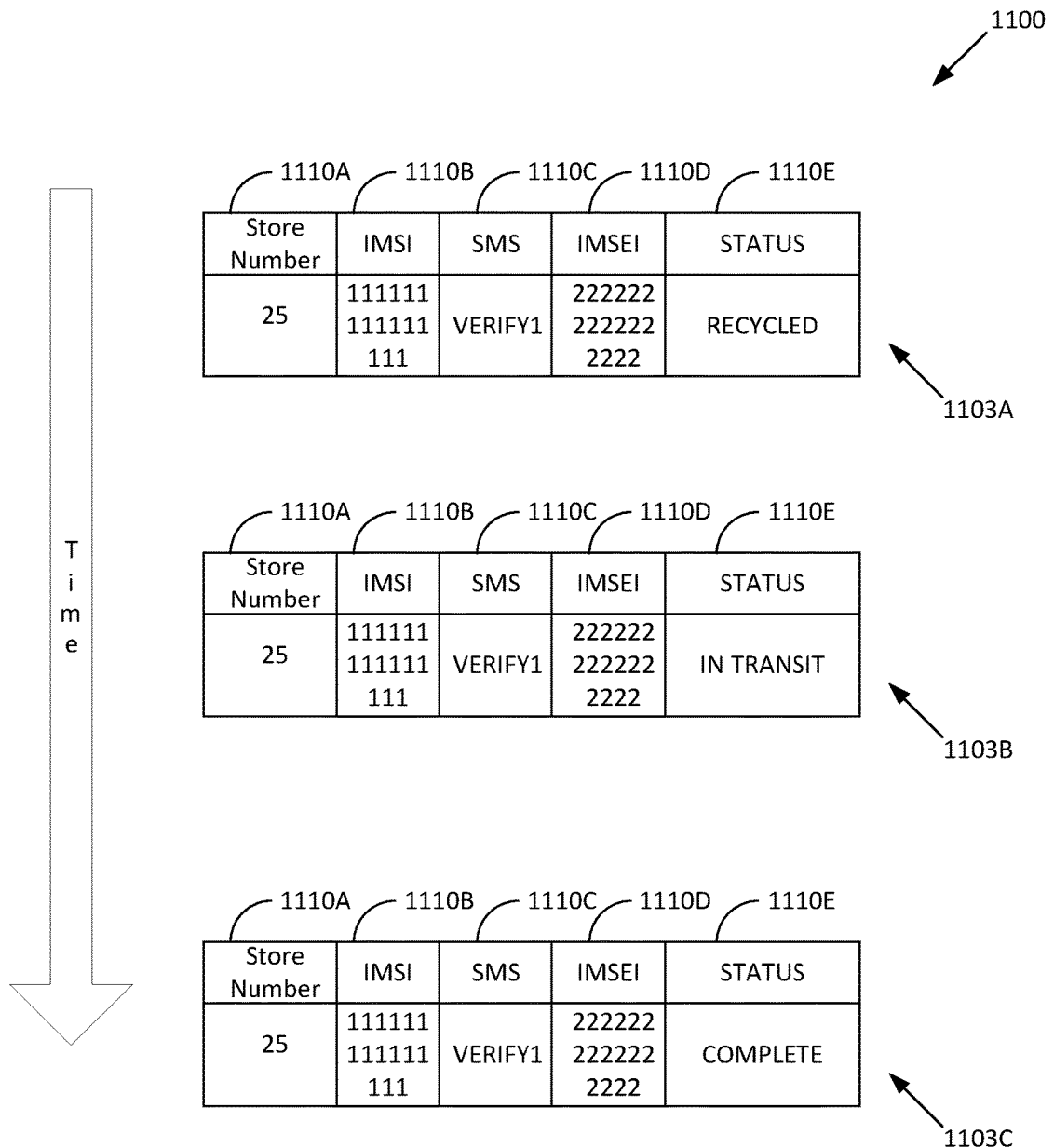
FIG. 10 is a diagram of an example tracking record that is created for a particular mobile device and updated during different phases of a recycling process, according to one embodiment and scenario.

FIG. 10 is a diagram of an example tracking record 1100 that is created for a particular mobile device (e.g., mobile device 1002 of FIG. 9) and updated during different phases of a recycling process. In particular, FIG. 10 shows three instances 1103A through 1103C of the tracking record 1100, each corresponding to a different time. For example, instance 1103A may correspond to a time when the tracking record 1100 is first created (e.g., after a user has agreed to exchange/recycle his or her mobile device at an apparatus similar to mobile device assessment apparatus 1004 of FIG. 9, and after a first tracking report has been received), instance 1103B may correspond to a time when the tracking record 1100 has been updated to reflect that the mobile device is on its way to a warehouse or other destination location (e.g., after the mobile device has been taken from the apparatus, and after a second tracking report has been received), and instance 1103C may correspond to a time when the mobile device has arrived at the destination location (e.g., after another individual has placed the mobile device in an apparatus similar to mobile device assessment apparatus 1022 of FIG. 9, and after a third tracking report has been received).

As seen in FIG. 10, the tracking record 1100 may include a number of fields 1110A through 1110E associated with identification information and/or other tracking information of a mobile device. Generally, in some embodiments, one or more of the fields 1110 may be populated and/or updated based on information within tracking reports, such as the tracking reports discussed above in connection with FIG. 9.

Store number field 1110A may contain an identifier associated with the retail store where the mobile device was initially received (e.g., the location of an apparatus such as mobile device assessment apparatus 1004 of FIG. 9). IMSI field 1110B may contain the IMSI of the mobile device. SMS field 1110C may contain information indicative of an SMS text message that has been, and/or will be, transmitted to the mobile device, as discussed further below. IMSEI field 1110D may contain the IMSEI of the mobile device. Status field 1110E may contain a status of the mobile device that reflects the current stage or phase within the recycling process.

The tracking record 1100 will now be described in connection with the system 1000 of FIG. 9, according to one embodiment and scenario. In this scenario, the mobile device assessment apparatus 1004 is located at a retail store and the mobile device assessment apparatus 1022 is located at a warehouse. Initially, a user may provide the mobile device 1002 to the mobile device assessment apparatus 1004 and the mobile device assessment apparatus 1004 may be configured to initiate tracking of the mobile device 1002 by establishing the cellular link with the mobile device 1002 and receiving the IMSEI and/or IMSI of the mobile device 1002. In one embodiment, once the user has accepted a monetary value in exchange for recycling the mobile device 1002, the mobile device assessment apparatus 1004 may be configured to transmit a first tracking report to the remote server 1012.

The remote server 1012 may then create the instance 1103A of the tracking record 1100 according to information provided within the first tracking report. For example, based on the first tracking report, the remote server 1012 may determine that the mobile device 1002 is associated with an IMSEI of "2222222222222222," and proceed to store that number within IMSEI field 1110D of the tracking record 1100. The remote server may also use the first tracking report to determine that the mobile device 1002 is associated with an IMSI of "1111111111111111," and proceed to store that number within IMSI field 1110B. The remote server 1012 may further determine that the mobile device 1002 was received at store "25," and proceed to store that store number within store number field 1110A. The remote server 1012 may also set a status to "Recycled" in the status field 1110E. The "Recycled" status may be a default initial state for a newly created tracking record, or may be set based on additional information in the first tracking report, for example.

The mobile device 1002 may then be picked up for delivery from the mobile device assessment apparatus 1004. In one embodiment, an individual may input, via display 1014, information indicating that the mobile devices contained in a repository of the mobile device assessment apparatus 1004 have been picked up for delivery, and in response to that input the mobile device assessment apparatus 1004 may transmit tracking reports indicative of the change in status of those mobile devices, including a second tracking report specifically associated with the mobile device 1002. Based on the received second tracking report, the remote server 1012 may update the field 1110E of the tracking record 1100 to reflect the change in status. For example, the remote server 1012 may update the status field 1110E to "In Transit" upon receipt of the second tracking report, as shown in instance 1103B of FIG. 10.

Once the mobile device 1002 reaches the recycling warehouse, the mobile device 1002 may be inserted within the mobile device assessment apparatus 1022. As described above with respect to the mobile device assessment apparatus 1004, the mobile device assessment apparatus 1022 may establish a wireless (e.g., cellular) communication link with the mobile device 1002, and use the link to receive the IMSEI and/or the IMSI from the mobile device 1002. The mobile device assessment apparatus 1022 may then transmit a third tracking report associated with the mobile device 1002 to the remote server 1012. The remote server 1012 may identify the appropriate tracking record to be updated (here, tracking record 1100) based on the IMSEI and/or IMSI included within the third tracking report, for example. Based on information within the third tracking report, the remote server 1012 may update the status in status field 1110E to a value reflecting completion of the tracked portion of the recycling process (e.g., "Completed" as shown in instance 1103C of FIG. 10).

The tracking record 1100 may be accessed in various ways, according to different embodiments. For example, an individual may use one or more computing devices with displays (computer terminal, desktop, laptop, smartphone, etc.) to view the progression of the mobile device 1002 based on the current state of the tracking record 1100. At any given point, once the mobile device 1002 has been accepted at the retail store, the individual may be able to look up the status and other information about the mobile device 1002 using the IMSEI and/or IMSI of the mobile device 1002. For example, if electronic records show that mobile device 1002 was never received at the warehouse, the tracking record 1110 may be accessed to determine whether the mobile device 1002 was last confirmed to be at the retail store, or in transit. As another example, if an individual at the warehouse determines that the mobile device 1002 has physical or operational defects that were not noticed previously, the individual may access the tracking record 1100 to determine the store number contained in store number field 1110A. The individual may then contact someone at that store to inform him or her of the situation, which may lead to a credit for the mobile device 1002 being revoked or decreased, for example.

In some embodiments, before or after creation of the tracking record 1100, the remote server 1012 may be configured to transmit an SMS text message to the mobile device assessment apparatus 1004. The mobile device assessment apparatus 1004 may be configured to transmit the SMS text message (e.g., in the scenario of FIG. 10, the message "VERIFY1") to the mobile device 1002 via the wireless communication (e.g., cellular) link and the one or more antennas (e.g., antennas 206A and 206B of FIG. 2) in order to test one or more aspects associated with the functionality of the mobile device 1002. Failure to receive the message may be indicative of faulty operation of the mobile device 1002, for example.

To confirm that the SMS text message has been correctly received by the mobile device 1002, an individual (e.g., the owner of the mobile device 1002, or a retail store employee) may be prompted via the display 1014 of the mobile device assessment apparatus 1004 to enter the received SMS text message (e.g., using a touch screen of the display 1014, or another input device). The mobile device assessment apparatus 1004 may then compare (e.g., using processor(s) 216 of FIG. 2, or processor 328 of FIG. 3) the entered information with the SMS text message transmitted by the server 1012. Upon a match between the entered information and the transmitted SMS text message, the mobile device assessment apparatus 1004 may notify the remote server 1012 of the match via the communications network 1008. The remote server 1012 may then proceed to create the tracking record 1100 (i.e., instance 1103A of the tracking record 1100). As seen in FIG. 10, the SMS text message used to confirm correct operation may be included in the tracking record 1100, in the field 1110C. In some embodiments, the tracking record 1100 may be created before confirmation of the SMS text message, and the SMS text message confirmation (or lack thereof) may be sent to the remote server 1012 at a later time.

In some embodiments, the SMS text message shown in field 1110C is also, or instead, used to confirm correct operation of the mobile device 1002 at the warehouse (e.g., using mobile device assessment apparatus 1022 instead of mobile device assessment apparatus 1004). In this manner, it may be determined whether the mobile device 1002 was damaged during transit, for example.

Although not shown in FIG. 10, the first instance 1103A of the tracking record 1100, the second instance 1103B of the tracking record 1100, and/or the third instance 1103C of the tracking record 1100 may also include one or more additional fields. For example, one or more additional fields associated with identifiers of employees associated with receiving the mobile device 1002 at the retail store and/or the recycling warehouse may be included. As another example, an additional field associated with an identifier of the recycling warehouse may be included. In yet another example, one or more additional fields associated with a make and the model of the mobile device 1002 may also be included. In still other embodiments, the tracking record 1100 omits some of the fields shown in FIG. 10. For example, the tracking record 1100 may omit the IMSI field 1110B and/or the SMS message field 1110C. Other examples of additional and/or omitted fields are possible as well.

Figure 11:
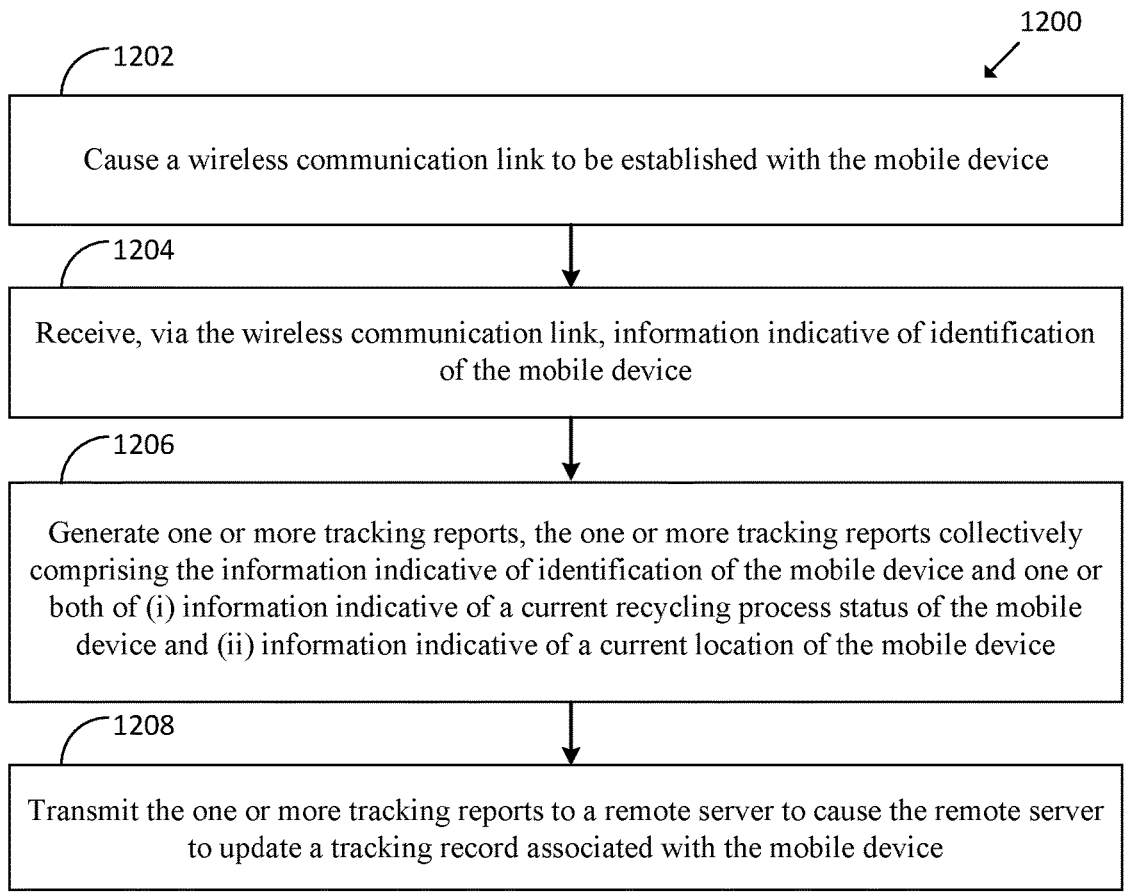
FIG. 11 depicts an example method for tracking a mobile device through different phases of a recycling process, from the perspective of an assessment apparatus, according to one embodiment.
Figure 12:
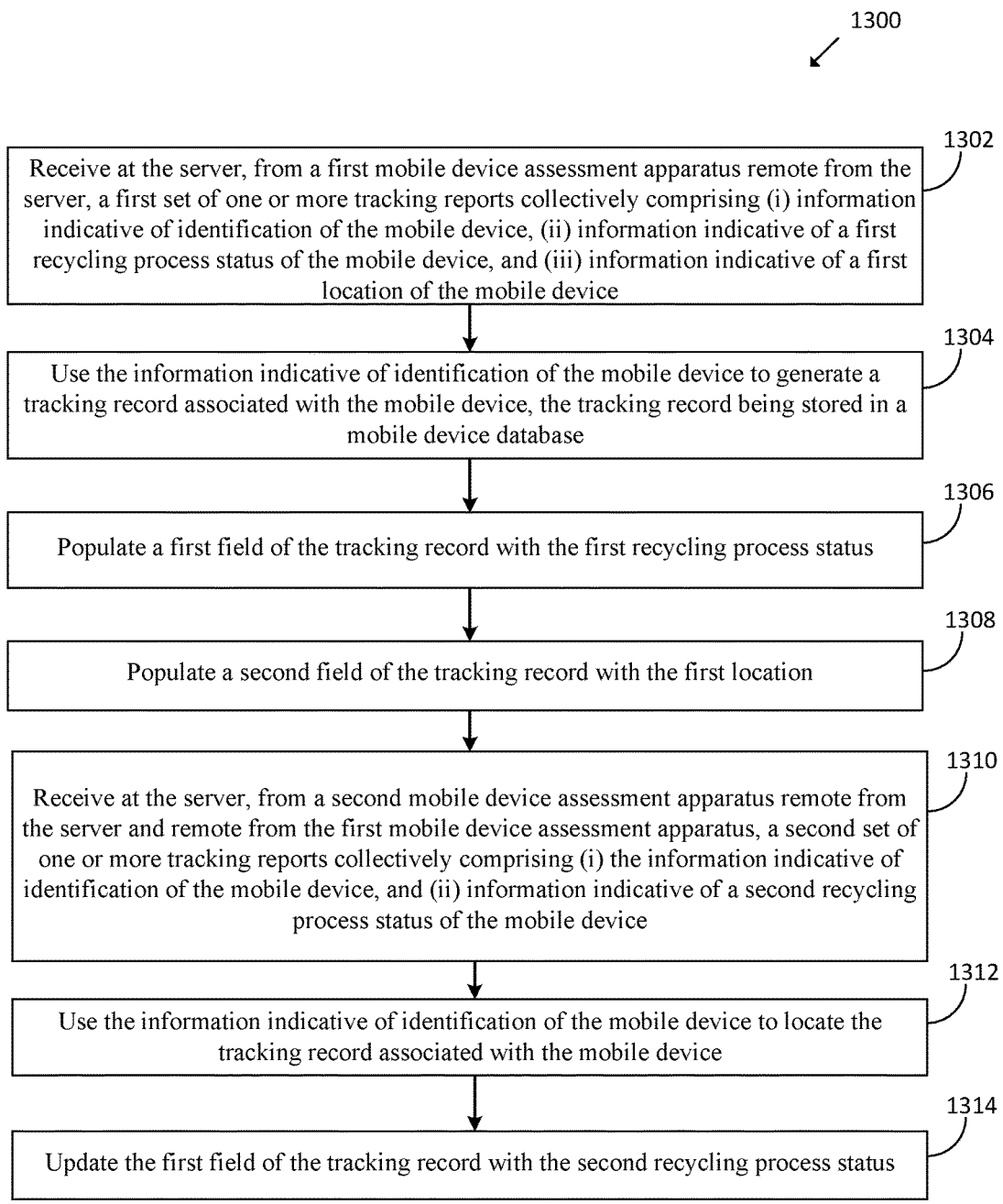
FIG. 12 depicts an example method for tracking a mobile device through different phases of a recycling process, from the perspective of a remote (e.g., cloud) server, according to one embodiment.

FIGS. 11 and 12 are flow diagrams of example methods for facilitating tracking of a mobile device in a recycling process, in accordance with at least some of the embodiments described herein. Although the blocks in each figure are illustrated in a sequential order, the blocks may in some instances be performed in parallel, and/or in a different order than those described therein. Also, the various blocks may be combined into fewer blocks, divided into additional blocks, and/or removed based upon the desired implementation.

In addition, the flowcharts of FIGS. 11 and 12 each show the functionality and operation of one implementation of the present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer-readable media that stores data for short periods of time, such as register memory, processor cache, or Random Access Memory (RAM), and/or persistent long term storage, such as read only memory (ROM), optical or magnetic disks, or compact-disc read only memory (CD-ROM), for example. The computer readable media may also be, or include, any other volatile or non-volatile storage systems. The computer readable medium may be considered a computer readable storage medium, a tangible storage device, or other article of manufacture, for example.

Alternatively, each block in FIG. 11 or 12 may represent circuitry that is wired to perform the specific logical functions in the process. Illustrative methods, such as those shown in FIGS. 11 and 12, may be carried out in whole or in part by a component or components in the cloud and/or system. However, it should be understood that the example methods may instead be carried out by other entities or combinations of entities (i.e., by other computing devices and/or combinations of computing devices), without departing from the scope of the invention. For example, functions of the method of FIG. 11 or 12 may be fully performed by a computing device (or components of a computing device such as one or more processors), or may be distributed across multiple components of the computing device, across multiple computing devices, and/or across a server.

Referring first to FIG. 11, the example method 1200 may include one or more operations, functions, or actions as illustrated by blocks 1202-1208. In one embodiment, the method 1200 is implemented in whole or in part by the mobile device assessment apparatus 1004 of FIG. 9 (or one or more processors thereof), the mobile device assessment apparatus 1022 of FIG. 9 (or one or more processors thereof), the processor(s) 216 of FIG. 2, or the processor 328 of FIG. 3.

As shown by block 1202, the method 1200 includes causing a wireless communication link (e.g., a cellular link) to be established with the mobile device (e.g., mobile device 1002 of FIG. 9). In one embodiment, the wireless communication link may be established with the mobile device within a chamber of a faraday cage. Block 1202 may include broadcasting cellular information via one or more antennas at least partially disposed within the chamber (e.g., antennas 206a and 206b of FIG. 2) of the faraday cage. In one embodiment, the mobile device may be configured to search for one or more signals (e.g., beacons) in order to establish a wireless communication link once the mobile device is within the faraday cage. Due to the attenuation of RF signals entering and exiting the chamber, the mobile device may only detect signals from the antenna(s) within the chamber, and thereby establish the wireless communication link rather than another, external link (e.g., to an external base station of another cell). The wireless communication link may be established in a manner similar to that discussed above in connection with FIG. 1 or FIG. 9, for example.

As shown by block 1204, the method 1200 also includes receiving, via the wireless communication link, information indicative of identification of the mobile device. In one embodiment, the information indicative of identification includes an IMSEI of the mobile device. Alternatively, or in addition, the information indicative of identification may include an IMSI of the mobile device, and/or other suitable identifying information.

As shown by block 1206, the method 1200 also includes generating one or more tracking reports. Collectively, the one or more tracking reports include the information indicative of identification of the mobile device, and also include one or both information indicative of a current recycling process status of the mobile device (e.g., "Recycled" or "Complete") and information indicative of a current location of the mobile device (e.g., a particular retail store number or name, or a warehouse number or name, etc.). In some embodiments, the tracking report(s) collectively include all three types of information.

In one embodiment where the tracking report(s) include the information indicative of the current recycling process status of the mobile device, that information is indicative of at least whether the mobile device has been deposited for recycling, whether the mobile device is in transit to a recycling warehouse, and whether the mobile device has arrived at the recycling warehouse. For example, a status of "In Transit" may indicate that the mobile device has been deposited for recycling and is in transit to a warehouse, but has not yet arrived at the warehouse. Generally, current recycling process status may be used to track missing mobile devices, and/or to forecast the need for parts and/or labor (e.g., depending on the number of mobile devices in the various stages of the recycling process), for example.

In one embodiment where the tracking report(s) include the information indicative of the current location of the mobile device, that information includes an identifier of a retail store or a recycling warehouse. The identifier may include a name, a city associated with the retail store or recycling warehouse, one or more numbers, and/or an alphanumeric combination, for example.

In some embodiments, generating the one or more tracking reports, and/or transmitting the one or more tracking reports, is in response to a user of the mobile device indicating, via a user interface, an agreement to exchange or recycle the mobile device. In one such embodiment, if the user of the mobile device were instead not satisfied with the offer associated with exchanging or recycling the mobile device, then the user could have chosen to keep the mobile device and thereby prevent the recycling process from occurring.

As shown by block 1208, the method 1200 also includes transmitting the one or more tracking reports to a remote server (e.g., remote server 1012 of FIG. 9) to cause the remote server to update a tracking record associated with the mobile device. For example, block 1208 may include receiving the IMSEI from the mobile device and, in response to receiving the IMSEI, transmitting to the remote server a tracking report that includes a status of "Recycled" to indicate that the mobile device has been submitted for recycling but not yet picked up for delivery, or a status of "Complete" to indicate that the mobile device has reached the recycling warehouse.

In some embodiments, the method 1200 includes one or more additional blocks not shown in FIG. 11. For example, the method 1200 may also include transmitting, via the wireless communication link, a message comprising a test code to the mobile device. In one example, the test code may be transmitted as an SMS text message while the mobile device is positioned within a chamber of a faraday cage. In addition, the method 1200 may include receiving, via a user interface (e.g., via display 1014 of FIG. 9), a user-entered code (e.g., the SMS text message as received and displayed on the mobile device). The user may be prompted to enter the code in order to verify one or more aspects of functionality associated with the mobile device. The method 1200 may further include comparing the user-entered code and the test code to determine whether the user-entered code matches the test code. In one such embodiment, block 1206 and/or block 1208 may occur in response to determining that the user-entered code matches the test code. The method 1200 may also include, before transmitting the message comprising the test code to the mobile device, receiving the test code from the remote server.

Referring next to FIG. 12, the example method 1300 may include one or more operations, functions, or actions as illustrated by blocks 1302-1314. In one embodiment, the method 1300 is implemented in whole or in part by the remote server 1012 of FIG. 9 or the remote server 112 of FIG. 1.

As shown by block 1302, the method 1300 includes receiving at the server, from a first mobile device assessment apparatus remote from the server (e.g., mobile device assessment apparatus 1104 of FIG. 9), a first set of one or more tracking reports. Collectively, the first set of tracking reports includes information indicative of identification of the mobile device, information indicative of a first recycling process status of the mobile device, and information indicative of a first location of the mobile device. The information indicative of identification of the mobile device may include an IMSEI of the mobile device, and/or other identifying information. The information indicative of the first recycling process status may indicate that the mobile device has been deposited for recycling, and the information indicative of the first location may indicate that the mobile device is at a particular retail store, for example.

As shown by block 1304, the method 1300 also includes using the information indicative of identification of the mobile device to generate a tracking record associated with the mobile device. In one example, the tracking record may be stored in a mobile device database (e.g., a database stored in a memory of remote server 1012 of FIG. 9 or remote server 112 of FIG. 1).

As shown by block 1306, the method 1300 also includes populating a first field of the tracking record with the first recycling process status. In one example, the first field may be the status field 1110E of FIG. 10.

As shown by block 1308, the method 1300 also includes populating a second field of the tracking record with the first location. In one example, the second field may be the store number field 1110A of FIG. 10.

As shown by block 1310, the method 1300 also includes receiving at the server, from a second mobile device assessment apparatus remote from the server (e.g., mobile device assessment apparatus 1022 of FIG. 9) and remote from the first mobile device assessment apparatus, a second set of one or more tracking reports. Collectively, the second set of tracking reports includes the information indicative of identification (e.g., the IMSEI) of the mobile device, and information indicative of a second recycling process status of the mobile device The information indicative of the second recycling process status may indicate the mobile device has arrived or been accepted at a recycling warehouse, for example.

As shown by block 1312, the method 1300 also includes using the information indicative of identification of the mobile device to locate the tracking record associated with the mobile device. For example, the IMSEI of the mobile device may be used to find to appropriate entry in the mobile device database.

As shown by block 1314, the method 1300 also includes updating the first field of the tracking record with the second recycling process status.

In one embodiment, the second set of tracking reports may further include information indicative of a second location of the mobile device. In this embodiment, the method 1300 may also include populating a third field of the tracking record with the second location. In one embodiment, the information indicative of the second location of the mobile device indicates the mobile device is at a particular recycling warehouse.

In one embodiment, after populating the first field of the tracking record with the first recycling process status, and before updating the first field of the tracking record with the second recycling process status, the method 1300 may include receiving, at the server (e.g., remote server 1012 of FIG. 9), a message indicating that the mobile device is in transit, and updating the first field of the tracking record (e.g., status field 1110E of FIG. 10) with a third recycling process status indicating that the mobile device is in transit.

In another embodiment, the method 1300 may include generating a test code and associating the test code with the tracking record. The method 1300 may include transmitting the test code to the first mobile device assessment apparatus and/or the second mobile device assessment apparatus. In one example, the test code may serve as a partial test of one or more aspects associated with the functionality of the mobile device.

In addition to, or instead of, some or all of the applications described above (e.g., determining exchange values, topping up mobile device accounts, reverse logistics, etc.), an assessment apparatus may be used for one or more other applications/purposes. A few such examples will now be described.

One such alternative/additional application relates to determining a best exchange/recycling value for a mobile device. As the technology associated with mobile devices (e.g., mobile phones) continues to be developed, new models of mobile devices are continuously being produced. As a result, many individuals tend to replace their current mobile devices with new mobile devices fairly often (e.g., shortly after a new model is made available). In many cases, an individual's current mobile device still has some monetary value at the time when the individual is purchasing the new mobile device.

Some of the problems that arise in recycling and/or exchanging a mobile device may be attributed to the effort required by an individual to receive a buy-back value (e.g., a monetary value) in exchange for surrendering the mobile device for recycling. For example, the individual may need to spend time locating a mobile device recycler, reviewing offers from the mobile device recycler, and determining a condition of the mobile device in regard to the offers. In some cases, even after locating a mobile device recycler and proceeding with all the required steps to determine a buy-back value of the mobile device, the individual may miss out on the best buy-back value of the mobile device by not being aware of offers from other mobile device recyclers. For example, the individual may be unable to devote adequate time to researching and/or contacting different mobile device recyclers.

By implementing certain aspects of the invention described herein, a system may overcome or mitigate these and/or other drawbacks of conventional processes and systems for facilitating the buy-back of a mobile device. Generally, the system may be used to provide an individual with a list of new mobile devices to choose from, assess a current mobile device, and based on the assessment of the current mobile device and buy-back offers from multiple mobile device recyclers, provide the individual with the best buy-back value available. For example, the individual may be provided with the option of purchasing a new mobile device at a reduced price based on the buy-back value of the current mobile device.

In some embodiments, the system for facilitating buy-back of a mobile device includes a mobile device assessment apparatus, such as a kiosk within a retail store or other commercial building, for example. In one embodiment, the mobile device assessment apparatus may include a housing and a display. The mobile device assessment apparatus may also include one or more processors that execute software instructions (stored in a persistent memory) to enable the various operations and functions of the mobile device assessment apparatus as described below. The mobile device assessment apparatus may provide some or all of the functionality described above in connection with the assessment apparatus 104 of FIG. 1. For example, the mobile device assessment apparatus may, alone or in conjunction with a remote server (e.g., remote server 112 of FIG. 1), determine a make and model of the mobile device using an IMSEI and/or IMSI obtained via a cellular link with the mobile device, assess a physical condition of the mobile device based at least in part on one or more captured images (e.g., using imaging devices 212a and 212b of FIG. 2), and so on.

The mobile device assessment apparatus may be in operative communication with a remote server (e.g., via a network similar to communications network 108 of FIG. 1), and may send the remote server some or all of the results of the assessment (e.g., make and model, physical condition and/or images, etc.). The remote server may generally store and maintain buy-back valuation information for a number of mobile devices, and possibly also pricing information for new mobile devices. In various embodiments, the remote server comprises a plurality of servers, or only a single server. The remote server may be in communication with servers of multiple recyclers via one or more networks. In one embodiment, the functionality of the remote server is instead incorporated in the mobile device assessment apparatus, which directly communicates with servers of multiple recyclers. In one embodiment, the remote server is the same as a remote server, if any, that was used during the mobile device assessment process (e.g., remote server 112 of FIG. 1). Alternatively, the remote server may be different than any remote server used during the mobile device assessment process.

The servers associated with some or all of the multiple recyclers may use predetermined algorithms to automatically determine buy-back values based on the information received from the mobile device assessment apparatus. For example, the algorithms may be configured to account for the make, the model, and the physical condition of the mobile device in order to determine the buy-back values. Alternatively, individuals associated with (e.g., employees of) some or all of the recyclers may be tasked with determining the buy-back values based on the information received from the mobile device assessment apparatus.

A pricing engine may be used to determine the pricing of new mobile devices based on one or more recycler buy-back values. In one embodiment, one or more processors of the remote server may be configured to execute the pricing engine. In another embodiment, one or more processors of the mobile device assessment apparatus may be configured to execute the pricing engine. In one example, the pricing engine determine the best buy-back value from among the multiple recyclers, determine the starting (e.g., retail) price of the new mobile device selected by the individual, subtract the best buy-back value, and apply any other discounts associated with the new mobile device in order to provide the best packaged offer to the individual for purchasing the new mobile device. In other embodiments and/or scenarios, the individual is offered cash (or a credit, etc.) for recycling his or her mobile device, without requiring that the individual purchase a new mobile device.

Operation of system will now be described in connection with an example scenario in which the mobile device assessment apparatus is located in a retail store. In this scenario and embodiment, the user associated with (e.g., an owner of) the mobile device may decide that he or she would like to exchange and/or recycle the mobile device in order to purchase a new mobile device at a price that is reduced based at least in part on the buy-back value of the user's current mobile device. The user may visit the retail store and place the mobile device in a drawer of the mobile device assessment apparatus. The user may then be provided a list of new mobile devices to choose from by using the display of the mobile device assessment apparatus, for example.

The processor(s) of the mobile device assessment apparatus may perform the method 400 of FIG. 4 or the method 500 of FIG. 5 in order to assess the mobile device. The processor(s) may then use the assessment of the mobile device to apply the buy-back values associated with one or more recyclers. In one embodiment, the price of the new mobile device may be determined (e.g., the processor(s) may execute the pricing engine) by subtracting the best buy-back value from the price of the new mobile device. In one embodiment and scenario, the best buy-back value may be the highest monetary value provided in exchange for the mobile device. In another embodiment and scenario, however, the best buy-back value may not be strictly associated with the highest monetary value of the mobile device (e.g., due to certain recyclers requiring higher pick-up or transit fees, which may be deducted from the respective buy-back values).

In one embodiment, after the best packaged offer has been determined, the mobile device assessment apparatus may provide that offer via a display of the mobile device assessment apparatus (e.g., display 114 of FIG. 1). In one example, the price of the new mobile device may be provided for display along with information of the recycler corresponding to the best buy-back value of the current mobile device. In another example, one or more recycler's buy-back values of the current mobile device may also be displayed for comparison. In one embodiment, the user could be presented with an option to choose a given recycler based on the information provided via the display. In other embodiments, the user is not presented with any information about the recyclers or buy-back values.

In one embodiment and scenario, the user may indicate acceptance of the best packaged offer that involves surrendering the mobile device in exchange for the discounted new mobile device. For example, the user may be prompted to accept or reject the offer, and may accept by pressing a "yes" or "accept" button on the display of the mobile device assessment apparatus. In response to the user accepting the offer, the user may be provided with confirmation or approval of the best packaged offer via an SMS text message, an email, and/or a printed voucher, for example. In one scenario, the user may provide his or her current mobile device to an employee in addition to a notification of approval of the best packaged offer, and then proceed to purchase the new mobile device. In another scenario, the current mobile device may be stored by the mobile device assessment apparatus (e.g., as discussed above in connection with FIGS. 1 and 9) and the user provided with a printed voucher. In this scenario, the user may proceed to purchase the new mobile device from the retail store and provide the printed voucher to receive the best packaged offer.

Other alternative/additional applications relate to tailoring offers to specific customers, and/or generating "leads" for contacting customers. Many telecommunications service providers have predetermined national marketing campaigns that are focused on retaining current customers and/or obtaining new customers. As a result of a national marketing campaign being structured in a particular way (e.g., targeting customers associated with a specific make of a mobile device, targeting customers with little time remaining on their current contract, etc.), the offers associated with the national marketing campaign may hold little appeal for many existing or potential customers. That is, some of the problems associated with gaining or retaining customers may be attributed to not providing sufficiently tailored offers to customers. For example, a particular individual may be willing to stay with a current telecommunications service provider so long as he or she is given an option to purchase a particular mobile device (e.g., the next version of the smartphone that he or she already owns) at a discount, and/or may be willing to stay with a current telecommunications service provider so long as he or she is offered a better data plan that better reflects his or her past usage. Typically, however, telecommunications service providers fail to use any information about individual preferences, and therefore are unable to provide individuals with tailored offers regarding the purchase of a new mobile device and/or service plan.

By implementing certain aspects of the invention described herein, a system may overcome or mitigate these and/or other drawbacks of conventional processes and systems. Generally, a system according to one aspect of the present invention may be used to assess a current mobile device, access a customer profile based on the assessment, and use information from the customer profile to provide an individual with the best offer associated with the purchase of a mobile device and/or a new service plan. For example, the individual may be provided with the option of purchasing a particular new mobile device at a reduced price based on one or more factors associated with the customer profile.

In some embodiments, the system for providing a best offer includes a mobile device assessment apparatus, such as a kiosk within a retail store or other commercial building, for example. In one embodiment, the mobile device assessment apparatus may include a housing and a display. The mobile device assessment apparatus may also include one or more processors that execute software instructions (stored in a persistent memory) to enable the various operations and functions of the mobile device assessment apparatus as described below. The mobile device assessment apparatus may provide some or all of the functionality described above in connection with the assessment apparatus 104 of FIG. 1. For example, the mobile device assessment apparatus may, alone or in conjunction with a remote server (e.g., remote server 112 of FIG. 1), determine a make and model of the user's current mobile device using an IMSEI and/or IMSI obtained via a cellular link with the mobile device, assess a physical condition of the mobile device based at least in part on one or more captured images (e.g., using imaging devices 212a and 212b of FIG. 2), and so on.

The mobile device assessment apparatus may be in operative communication with a remote server (e.g., via a network similar to communications network 108 of FIG. 1). The remote server may generally store and maintain customer profiles for multiple users in a profile database stored in one or more persistent memories. Each customer profile in the profile database may include various types of information, such as information associated with a mobile device user (e.g., name, IMSI, age, residential address, etc.), information associated with the user's mobile device (e.g., make and model, IMSEI, date of purchase, etc.), information associated with the user's telecommunications service provider (e.g., name, date of first service by that provider, whether the mobile account is prepaid or monthly, etc.), and/or information regarding the user's telecommunications service usage characteristics (e.g., average hours of voice or data usage per month, average number of SMS text messages per month, etc.).

In various embodiments, the remote server comprises a plurality of servers, or only a single server. The remote server may be a server of a particular telecommunications service provider, for example. While the description below refers to a "remote" server, the functionality of the server may, in some embodiments, instead be incorporated in the mobile device assessment apparatus itself. In one embodiment, the remote server is the same as a remote server, if any, that was used during the mobile device assessment process (e.g., remote server 112 of FIG. 1). Alternatively, the remote server may be different than any remote server used during the mobile device assessment process.

After assessing a user's current mobile device, the mobile device assessment apparatus may send some or all of the results of the assessment to the remote server. In one embodiment, the mobile device assessment apparatus sends at least the IMSI and/or IMSEI to the remote server. At least some of the information from the mobile device assessment apparatus may be used by the remote server to locate the customer profile corresponding to the user of the mobile device. For example, the remote server may use the IMSI and/or IMSEI to locate the user's customer profile in the profile database. In some embodiments where the mobile device assessment apparatus sends additional information (e.g., make and model), that additional information may be used to update information in the user's customer profile.

Once the appropriate customer profile has been located, the remote server may implement a customer relationship management engine to determine a best offer. The best offer may be a best offer for the sale of a specific, new mobile device, and/or may be a best offer for entering a specific contract with the telecommunications service provider (e.g., a specific data plan, a specific contract length/term, etc.), for example. One or more processors of the remote server may be configured to execute the customer relationship management engine, for example. The engine may use information from the customer profile, and possibly some of the information from the assessment/information provided by the mobile device assessment apparatus, to automatically determine the best offer. As one example, the customer relationship management engine may determine the best offer based on the current mobile device of the user (e.g., make and model), the type of the user's mobile account (e.g., prepaid or monthly), and/or gross margin associated with the new mobile device to be purchased. As another example, the customer relationship management engine may also, or instead, determine the best offer based on the monthly amount paid by the user for a current service plan, and/or the age of the user. In one example embodiment and scenario, if a user is known to have historically opted for a more expensive data plan offered by a telecommunications service provider, the customer relationship management engine may provide a greater discount towards the new mobile device as compared to another user that has historically utilized a lower data plan offered by the telecommunications service provider. In some embodiments and/or scenarios, the customer relationship management engine may also determine the best offer based on an estimated monetary value of the user's current mobile device (e.g., according to the physical condition of the current mobile device, as determined by the mobile device assessment apparatus using one or more captured images of the current mobile device).

Operation of the system will now be described in connection with the example system 100 of FIG. 1 and the example housing 200 of FIG. 2 (i.e., in an embodiment where the mobile device assessment apparatus is the assessment apparatus 104, and the housing 200 is used as the housing 116 of the assessment apparatus 104), and in connection with an example scenario in which the assessment apparatus 104 is located in a retail store. In this scenario and embodiment, a user associated with mobile device 102 (e.g., the user's current mobile device) may decide that he or she would like to purchase a particular new mobile device, and possibly exchange his or her mobile device 102. The user may visit the retail store and place his or her mobile device 102 in a drawer of the assessment apparatus 104. The processor(s) of the assessment apparatus 104 (e.g., processor(s) 216) may then determine information indicative of identification of the mobile device 102 (e.g., IMSEI and/or IMSI) through the use of wireless transceiver 208 and antennas 206a and/or 206b (e.g., by establishing a picocell). The processor(s) may then send the identifying information to a remote server to enable the remote server to access a customer profile of the user. In one embodiment, the customer profile may include the make and model of the mobile device, the telecommunications service provider associated with the mobile device, the average monthly charges associated with the mobile device account of the mobile device, an age of the user, and/or other information. Alternatively, some information of that sort may be included in the information sent to the remote server by the assessment apparatus 104. For example, the assessment apparatus may have first sent the IMSEI and/or IMSI to a different remote server (e.g., remote server 112) and received in response the make and model of the mobile device 102 (e.g., as described above in connection with FIG. 1), and then sent the make and mode along with the IMSEI and/or IMSI to the remote server with the customer relationship management engine for purposes of determining a best offer. The remote server with the customer relationship management engine may then determine the best offer for purchasing a particular new mobile device (e.g., a mobile device indicated by the user via a touch screen of the mobile device assessment apparatus), and/or a particular service plan (e.g., a data plan indicated by the user via the touch screen) based on some or all of the information in the user's customer profile.

In one embodiment, after the best offer has been determined, the assessment apparatus 104 may provide the best offer via a display of the assessment apparatus 104 (e.g., display 114). In one example, the price of a new mobile device and/or service plan may be provided for display along with the option to accept or reject the best offer.

In one embodiment and scenario, the user may indicate acceptance of the best offer, which may require surrendering the mobile device 102 in exchange for the discounted new mobile device. For example, the user may accept the best offer by pressing a "yes" or "accept" button on the display of the assessment apparatus 104. In response to the user accepting the offer, the user may be provided with confirmation or approval of the best offer via an SMS text message (sent to mobile device 102), an email, and/or a printed voucher, for example. In one scenario, the user may provide his or her current mobile device 102 to an employee in addition to a notification of approval of the best offer, and then proceed to purchase the new mobile device and/or enter the new service plan. In another scenario, the current mobile device 102 may be stored in a repository of the assessment apparatus 104 (e.g., as discussed above in connection with FIGS. 1 and 9) and the user provided with a printed voucher. In this scenario, the user may proceed to purchase the new mobile device and/or enter the new service agreement, according to the accepted offer terms, while at the retail store by providing the printed voucher to a store employee.

In another embodiment and scenario, the user may indicate rejection of the best offer. For example, the user may reject the best offer by pressing a "no" or "reject" button on the display of the assessment apparatus 104. In response to the user rejecting the offer, the user may be provided with a next best offer, which may also be determined based on an algorithm implemented by the customer relationship management engine. The next best offer may include a different mobile device than what was presented in the initial best offer, and/or may include changes to one or more features of a potential service plan (e.g., a higher or lower level data plan), for example. The different mobile device may be one specifically indicated by the user (e.g., by selecting from a list displayed on display 114), or may be one the customer relationship management engine predicts the user would be interested in based on the customer profile. The user may choose to accept or reject the next best offer in a manner similar to that described above. This process, with additional next best offers each time a current offer is rejected, may continue indefinitely, or for a predetermined number of rounds. For example, the assessment apparatus 104 may signal that a store employee should approach/help the user if three consecutive offers have been rejected by the user.

In one embodiment, in the event that the user decides not to proceed with the purchase of a new mobile device and/or enter a new service plan, the assessment apparatus 104 may prompt the user to indicate whether he or she is willing to authorize an individual to contact the user to discuss further options pertaining to the purchase of a new mobile device and/or service plan. In one scenario, if the user provides authorization, the assessment apparatus 104 may store the information pertaining to the user and one or more offers presented to the user by the customer relationship management engine. The assessment apparatus 104 may then compile a list of one or more users that provided authorization to be contacted, and present the list for display to one or more individuals (e.g., retail store or telecommunications service provider employees, etc.) who may wish to contact those individuals in the future to follow up on sales opportunities.

In one scenario, the assessment apparatus 104 may rank the one or more users within the list based on a determined customer value. For example, the processor(s) of the assessment apparatus 104 may take into consideration the make and model of the mobile device 102 along with one or more mobile devices that the user was possibly interested in purchasing (e.g., as determined based on the user's inputs/choices made via the display 114). As another example, the users within the list may be ranked according to a monetary value associated with the current mobile device 102 (e.g., the retail price of mobile device 102 and/or a currently assessed value of the mobile device 102), the user's current service plan, and/or other information.

The patent claims at the end of this patent application are not intended to be construed under 35 U.S.C. §112(f) unless traditional means-plus-function language is expressly recited, such as "means for" or "step for" language being explicitly recited in the claim(s).

Moreover, although the foregoing text sets forth a detailed description of numerous different embodiments, it should be understood that the scope of the patent is defined by the words of the claims set forth at the end of this patent. The detailed description is to be construed as exemplary only and does not describe every possible embodiment because describing every possible embodiment would be impractical, if not impossible. Numerous alternative embodiments could be implemented, using either current technology or technology developed after the filing date of this patent, which would still fall within the scope of the claims. By way of example, and not limitation, the disclosure herein contemplates at least the following aspects:

Aspect 1: An apparatus for assessing a mobile device, the apparatus comprising: a housing comprising a faraday cage, wherein the faraday cage comprises a chamber having an ingress mechanism configured to enable a user to position the mobile device within the chamber; one or more antennas at least partially disposed within the faraday cage; a wireless transceiver coupled to the one or more antennas; one or more illuminating components configured to provide illumination within the chamber; one or more imaging devices; and one or more processors communicatively coupled to the wireless transceiver and the one or more imaging devices, wherein the one or more processors are configured to use the wireless transceiver to establish a wireless communication link with the mobile device when the mobile device is positioned within the chamber, and use the one or more imaging devices to capture one or more images of the mobile device when the mobile device is positioned within the chamber.

Aspect 2: The apparatus of claim 1, wherein the faraday cage is configured to attenuate electromagnetic signals entering or exiting the chamber by at least 50 dB.

Aspect 3: The apparatus of aspect 1, wherein the faraday cage is configured to attenuate the electromagnetic signals by at least 65 dB.

Aspect 4: The apparatus of any one of aspects 1-3, wherein the one or more processors are (i) communicatively coupled to the one or more illuminating components, and (ii) configured to activate and de-activate the one or more illuminating components.

Aspect 5: The apparatus of any one of aspects 1-4, wherein the one or more processors are configured to activate the one or more illuminating components in response to detecting that the mobile device is positioned within the chamber.

Aspect 6: The apparatus of any one of aspects 1-5, wherein the one or more imaging devices comprises: a first camera located within the faraday cage and configured to capture at least a front side of the mobile device; and a second camera located within the faraday cage and configured to capture at least a rear side of the mobile device.

Aspect 7: The apparatus of any one of aspects 1-6, wherein the one or more processors are configured to use the wireless transceiver to establish the wireless communication link with the mobile device at least by setting up a picocell.

Aspect 8: The apparatus of any one of aspects 1-7, wherein the ingress mechanism comprises a moveable drawer configured to move between an open position and a closed position, and wherein the moveable drawer is configured to receive the mobile device when in the open position.

Aspect 9: The apparatus of any one of aspects 1-8, further comprising: a touchscreen coupled to the housing and communicatively coupled to the one or more processors, wherein the touchscreen is configured to receive a user input associated with identifying information of the mobile device.

Aspect 10: The apparatus of any one of aspects 1-9, wherein the one or more processors are configured to establish the wireless communication link, based at least in part on the received user input.

Aspect 11: The apparatus of any one of aspects 1-10, wherein the one or more processors are configured to transmit the captured one or more images to a remote computer having a user interface, wherein the user interface is configured to enable a review of the captured one or more images.

Aspect 12: The apparatus of any one of aspects 1-11, wherein the one or more processors are configured to use the wireless communication link to obtain information indicative of identification of the mobile device.

Aspect 13: The apparatus of aspect 12, wherein the information indicative of identification of the mobile device includes one or both of (i) an international mobile station equipment identity, and (ii) an international mobile subscriber identity.

Aspect 14: A computer-implemented method for assessing a mobile device, the method comprising: causing, by one or more processors, a wireless communication link to be established with a mobile device positioned within a chamber of a faraday cage; receiving, by the one or more processors and via the wireless communication link, information indicative of identification of the mobile device; determining, by the one or more processors, a make and a model of the mobile device based on the information indicative of identification of the mobile device; capturing, by one or more imaging devices, one or more images of the mobile device while the mobile device is positioned within the chamber; determining, by the one or more processors, a condition of the mobile device based on the one or more images of the mobile device; determining, by the one or more processors, a monetary value of the mobile device based on (i) the make and the model of the mobile device and (ii) the determined condition of the mobile device; and providing for display to a user, by the one or more processors, an assessment of the mobile device, wherein the assessment of the mobile device includes one or both of (i) the determined condition and (ii) the determined monetary value.

Aspect 15: The computer-readable medium of aspect 14, wherein receiving the information indicative of identification comprises receiving an international mobile station equipment identity.

Aspect 16: The computer-readable medium of any one of aspects 14-15, wherein receiving the information indicative of identification comprises receiving an international mobile subscriber identity.

Aspect 17: The computer-readable medium of any one of aspects 14-16, wherein determining the condition comprises: receiving, by the one or more processors, information indicative of a stock image of a corresponding mobile device according to the make and the model of the mobile device; comparing, by the one or more processors, the information indicative of the stock image to the captured one or more images of the mobile device; and based on the comparison, determining, by the one or more processors, the condition.

Aspect 18: The computer-readable medium of any one of aspects 14-17, wherein determining the condition further comprises: determining, by the one or more processors, the condition based on one or more physical characteristics associated with the mobile device using image processing of (i) the information indicative of the stock image and (ii) the captured one or more images of the mobile device, wherein the one or more physical characteristics reflect damage to one or more external sides of the mobile device.

Aspect 19: The computer-readable medium of any one of aspects 14-18, wherein causing the wireless communication link to be established comprises broadcasting cellular information via one or more antennas within the chamber.

Aspect 20: A computer-implemented method for assessing a mobile device, the method comprising: causing, by one or more processors, a wireless communication link to be established with a mobile device positioned within a chamber of a faraday cage; receiving, by the one or more processors and via the wireless communication link, information indicative of identification of the mobile device; capturing, by one or more imaging devices, one or more images of the mobile device while the mobile device is positioned within the chamber; transmitting, by the one or more processors, (i) the information indicative of identification of the mobile device and (ii) the captured one or more images of the mobile device to a remote server configured to assess the mobile device; in response to transmitting to the remote server, receiving, by the one or more processors, (i) a condition of the mobile device and (ii) a monetary value of the mobile device; and providing for display to a user, by the one or more processors, an assessment of the mobile device, wherein the assessment of the mobile device includes one or both of (i) the condition of the mobile device and (ii) the monetary value of the mobile device.

Aspect 21: The computer-readable medium of aspect 20, wherein the information indicative of identification of the mobile device includes one or both of (i) an international mobile station equipment identity, and (ii) an international mobile subscriber identity.

Aspect 22: An apparatus for assessing a mobile device, the apparatus comprising: a housing comprising a faraday cage, wherein the faraday cage comprises a drawer for receiving the mobile device; one or more antennas at least partially disposed within the faraday cage; a wireless transceiver coupled to the one or more antennas; one or more illuminating components configured to provide illumination within the drawer; one or more imaging devices; a display coupled to the housing and configured to receive a user input; an actuator configured to move the drawer between an open position and a closed position; one or more processors communicatively coupled to the wireless transceiver and the one or more imaging devices, wherein the one or more processors are configured to use the wireless transceiver to establish a wireless communication link with the mobile device when the mobile device is positioned within the drawer and while the drawer is in the closed position, based on the established wireless communication link, capture information indicative of identification of the mobile device, use the one or more imaging devices to capture one or more images of the mobile device when the mobile device is positioned within the drawer and while the drawer is in the closed position, and use the display to provide an assessment of the mobile device based on one or both of (i) the captured information indicative of identification and (ii) the captured one or more images of the mobile device.

Aspect 23: The apparatus of aspect 22, wherein the one or more processors are configured to activate the actuator based on the received user input.

Aspect 24: The apparatus of aspect 23, wherein the one or more processors are configured to activate the actuator upon completion of the assessment of the mobile device.

Aspect 25: The apparatus of any one of aspects 22-24, wherein providing the assessment based on the captured information indicative of identification comprises: determining, by the one or more processors, one or both of (i) an international mobile station equipment identity of the mobile device and (ii) an international mobile subscriber identity of the mobile device; determining, by the one or more processors, a make and a model of the mobile device based on one or both of (i) the international mobile station equipment identity of the mobile device and (ii) the international mobile subscriber identity of the mobile device; determining, by the one or more processors, a monetary value of the mobile device based on the determined make and the determined model of the mobile device; and providing for display, by the one or more processors, the monetary value of the mobile device.

Aspect 26: The apparatus of any one of aspects 22-25, wherein providing the assessment based on the captured one or more images comprises: determining, by the one or more processors, a condition of the mobile device based on image processing of the captured one or more images; determining, by the one or more processors, a monetary value of the mobile device based on the determined condition; and providing for display, by the one or more processors, the monetary value of the mobile device.

Aspect 27: The apparatus of any one of aspects 22-26, wherein providing the assessment based on the captured information indicative of identification comprises: determining, by the one or more processors, one or both of (i) an international mobile station equipment identity of the mobile device and (ii) an international mobile subscriber identity of the mobile device; transmitting, by the one or more processors, one or both of (i) the determined international mobile station equipment identity of the mobile device and (ii) the determined international mobile subscriber identity of the mobile device to a remote server; in response to transmitting to the remote server, receiving, by the one or more processors a monetary value of the mobile device; and providing for display, by the one or more processors, the monetary value of the mobile device.

Aspect 28: The apparatus of any one of aspects 22-27, wherein providing the assessment based on the captured one or more images comprises: transmitting, by the one or more processors, the captured one or more images of the mobile device to a remote server; in response to transmitting to the remote server, receiving, by the one or more processors a monetary value of the mobile device; and providing for display, by the one or more processors, the monetary value of the mobile device.

Aspect 29: The apparatus of any one of aspects 22-28 wherein the faraday cage includes one or more sides comprising an aluminum alloy.

Aspect 30: The apparatus of any one of aspects 22-29, wherein the wireless transceiver is configured as a cellular base station to establish the wireless communication link with the mobile device.

Aspect 31: A computer-implemented method for topping up a mobile device account associated with a mobile device, the method comprising: causing, by one or more processors, a wireless communication link to be established with the mobile device; receiving, by the one or more processors and via the wireless communication link, information indicative of identification of the mobile device; receiving, by the one or more processors, information indicative of a desired payment associated with the mobile device account; and causing, by the one or more processors, the desired payment to be applied to the mobile device account, at least in part by sending the information indicative of identification of the mobile device and the information indicative of the desired payment to one or more remote servers.

Aspect 32: The computer-implemented method of aspect 31, wherein causing the wireless communication link to be established with the mobile device comprises causing the wireless communication link to be established with the mobile device while the mobile device is positioned within a faraday cage.

Aspect 33: The computer-implemented method of any one of aspects 31-32, wherein causing the desired payment to be applied to the mobile device account includes: sending the information indicative of identification of the mobile device to a first remote server of the one or more remote servers; in response to sending the information indicative of identification, receiving an account identifier associated with the mobile device account; and sending (i) the information indicative of the desired payment and (ii) the account identifier to a second remote server of the one or more remote servers.

Aspect 34: The computer-implemented method of any one of aspects 31-33, wherein receiving the information indicative of identification comprises receiving one or both of (i) an international mobile station equipment identity and (ii) an international mobile subscriber identity.

Aspect 35: The computer-implemented method of any one of aspects 31-34, wherein receiving the information indicative of the desired payment comprises determining that a particular amount of cash has been physically deposited.

Aspect 36: The computer-implemented method of any one of aspects 31-35, further comprising: providing, by the one or more processors, a graphical user interface, wherein receiving the information indicative of the desired payment includes determining that a user has indicated a particular payment amount via the graphical user interface.

Aspect 37: An apparatus for topping up a mobile device account associated with a mobile device, the apparatus comprising: a housing comprising a faraday cage, wherein the faraday cage comprises a drawer for receiving the mobile device; one or more antennas at least partially disposed within the faraday cage; a wireless transceiver coupled to the one or more antennas; a display coupled to the housing and configured to receive a user input; one or more processors communicatively coupled to the wireless transceiver and the one or more imaging devices, wherein the one or more processors are configured to (i) use the wireless transceiver to establish a wireless communication link with the mobile device while the mobile device is positioned within the drawer, (ii) receive, by the one or more processors and via the wireless communication link, information indicative of identification of the mobile device, (iii) receive, by the one or more processors, information indicative of a desired payment associated with the mobile device account, (iv) cause the desired payment to be applied to the mobile device account, at least in part by sending the information indicative of identification of the mobile device and the information indicative of the desired payment to one or more remote servers, and (v) use the display to provide a notification that the desired payment has been applied to the mobile device account.

Aspect 38: The apparatus of aspect 37, further comprising: a payment acceptor coupled to the housing and configured for receiving the desired payment, wherein the payment acceptor is communicatively coupled to the one or more processors.

Aspect 39: The apparatus of aspect 38, wherein the payment acceptor is configured to receive the desired payment in the form of one or more of (i) paper currency, (ii) coins, and (iii) a printed voucher.

Aspect 40: The apparatus of any one of aspects 38-39, wherein the payment acceptor is configured to receive the desired payment via one or more of (i) a credit card and (ii) a debit card.

Aspect 41: The apparatus of any one of aspects 37-40, wherein the information indicative of identification comprises an international mobile station equipment identity.

Aspect 42: The apparatus of any one of aspects 37-41, wherein the information indicative of identification comprises an international mobile subscriber identity.

Aspect 43: The apparatus of any one of aspects 37-42, wherein the one or more processors are further configured to determine the mobile device account based on the received information indicative of identification.

Aspect 44: A computer-implemented method for facilitating tracking of a mobile device in a recycling process, the method comprising: causing, by one or more processors, a wireless communication link to be established with the mobile device; receiving, by the one or more processors and via the wireless communication link, information indicative of identification of the mobile device; generating, by the one or more processors, one or more tracking reports, the one or more tracking reports collectively comprising the information indicative of identification of the mobile device and one or both of (i) information indicative of a current recycling process status of the mobile device and (ii) information indicative of a current location of the mobile device; and transmitting, by the one or more processors, the one or more tracking reports to a remote server to cause the remote server to update a tracking record associated with the mobile device.

Aspect 45: The computer-implemented method of aspect 44, wherein the information indicative of identification of the mobile device includes an international mobile station equipment identity of the mobile device.

Aspect 46: The computer-implemented method of any one of aspects 44-45, wherein generating one or more tracking reports includes generating one or more tracking reports collectively comprising (i) the information indicative of identification of the mobile device, (ii) the information indicative of a current recycling process status of the mobile device, and (iii) the information indicative of the current location of the mobile device.

Aspect 47: The computer-implemented method of any one of aspects 44-46, wherein the information indicative of the current recycling process status of the mobile device is indicative of at least whether the mobile device has been deposited for recycling, whether the mobile device is in transit to a recycling warehouse, and whether the mobile device has arrived at the recycling warehouse.

Aspect 48: The computer-implemented method of any one of aspects 44-47, wherein the information indicative of the current location of the mobile device includes an identifier of a retail store or recycling warehouse.

Aspect 49: The computer-implemented method of any one of aspects 44-48, further comprising: transmitting, by the one or more processors and via the wireless communication link, a message comprising a test code to the mobile device.

Aspect 50: The computer-implemented method of aspect 49, further comprising: receiving, by the one or more processors and via a user interface, a user-entered code; and comparing, by the one or more processors, the user-entered code and the test code to determine whether the user-entered code matches the test code, wherein either generating the one or more tracking reports, or transmitting the one or more tracking reports, is in response to determining that the user-entered code matches the test code.

Aspect 51: The computer-implemented method of any one of aspects 49-50, further comprising, before transmitting the message comprising the test code to the mobile device: receiving, by the one or more processors, the test code from the remote server.

Aspect 52: The computer-implemented method of any one of aspects 49-51, wherein the message is an SMS text message comprising the test code.

Aspect 53: The computer-implemented method of any one of aspects 44-52, wherein causing the wireless communication link to be established with the mobile device includes causing a cellular communication link to be established with the mobile device while the mobile device is positioned within a chamber of a faraday cage.

Aspect 54: The computer-implemented method of any one of aspects 44-53, wherein one or both of (i) generating the one or more tracking reports, and (ii) transmitting the one or more tracking reports, is in response to a user of the mobile device indicating, via a user interface, an agreement to exchange or recycle the mobile device.

Aspect 55: A computer-implemented method, implemented by one or more processors of a server, for facilitating tracking of a mobile device in a recycling process, the method comprising: receiving at the server, from a first mobile device assessment apparatus remote from the server, a first set of one or more tracking reports collectively comprising (i) information indicative of identification of the mobile device, (ii) information indicative of a first recycling process status of the mobile device, and (iii) information indicative of a first location of the mobile device; using, by the one or more processors, the information indicative of identification of the mobile device to generate a tracking record associated with the mobile device, the tracking record being stored in a mobile device database; populating, by the one or more processors, a first field of the tracking record with the first recycling process status; populating, by the one or more processors, a second field of the tracking record with the first location; receiving at the server, from a second mobile device assessment apparatus remote from the server and remote from the first mobile device assessment apparatus, a second set of one or more tracking reports collectively comprising (i) the information indicative of identification of the mobile device, and (ii) information indicative of a second recycling process status of the mobile device; using, by the one or more processors, the information indicative of identification of the mobile device to locate the tracking record associated with the mobile device; and updating, by the one or more processors, the first field of the tracking record with the second recycling process status.

Aspect 56: The computer-implemented method of aspect 55, wherein: the information indicative of the first recycling process status of the mobile device indicates the mobile device has been deposited for recycling; the information indicative of the first location of the mobile device indicates the mobile device is at a particular retail store; and the information indicative of the second recycling process status of the mobile device indicates the mobile device has arrived or been accepted at a recycling warehouse.

Aspect 57: The computer-implemented method of any one of aspects 55-56, further comprising, after populating the first field of the tracking record with the first recycling process status, and before updating the first field of the tracking record with the second recycling process status: receiving, at the server, a message indicating that the mobile device is in transit; and updating the first field of the tracking record with a third recycling process status indicating that the mobile device is in transit.

Aspect 58: The computer-implemented method of any one of aspects 55-57, further comprising: generating, by the one or more processors, a test code; associating, by the one or more processors, the test code with the tracking record; and transmitting, by the one or more processors, the test code to one or both of (i) the first mobile device assessment apparatus and (ii) the second mobile device assessment apparatus.

Aspect 59: The computer-implemented method of any one of aspects 55-58, wherein the information indicative of identification of the mobile device includes an international mobile station equipment identity of the mobile device.

What is claimed:

1. An apparatus for assessing a mobile device, the apparatus comprising:
a housing comprising a faraday cage, wherein the faraday cage comprises a chamber having an ingress mechanism configured to enable a user to position the mobile device within the chamber;
one or more antennas at least partially disposed within the faraday cage;
a wireless transceiver coupled to the one or more antennas;
one or more illuminating components configured to provide illumination within the chamber;
one or more imaging devices; and
one or more processors communicatively coupled to the wireless transceiver and the one or more imaging devices, wherein the one or more processors are configured to
use the wireless transceiver to establish a wireless communication link with the mobile device when the mobile device is positioned within the chamber, at least in part by establishing a cell,
use the wireless communication link to obtain information indicative of identification of the mobile device, the information indicative of identification of the mobile device including one or both of (i) an international mobile station equipment identity, and (ii) an international mobile subscriber identity,
use the one or more imaging devices to capture one or more images of the mobile device when the mobile device is positioned within the chamber,
transmit the information indicative of identification of the mobile device, and the captured one or more images, to a remote computer for analysis to determine a current value of the mobile device, and
after transmitting the information indicative of identification of the mobile device and the captured one or more images to the remote computer, receive a message indicating one or both of (i) the determined value, and (ii) an offer that is based on the determined value.

2. The apparatus of claim 1, wherein the one or more processors are (i) communicatively coupled to the one or more illuminating components, and (ii) configured to activate and de-activate the one or more illuminating components.

3. The apparatus of claim 2, wherein the one or more processors are configured to activate the one or more illuminating components in response to detecting that the mobile device is positioned within the chamber.

4. The apparatus of claim 1, wherein the one or more imaging devices comprises:
a first camera located within the faraday cage and configured to capture at least a front side of the mobile device; and
a second camera located within the faraday cage and configured to capture at least a rear side of the mobile device.

5. The apparatus of claim 1, wherein the one or more processors are configured to use the wireless transceiver to establish the wireless communication link with the mobile device at least in part by establishing a picocell.

6. The apparatus of claim 1, wherein the ingress mechanism comprises:
a moveable drawer configured to move between an open position and a closed position, wherein the moveable drawer is configured to receive the mobile device when in the open position.

7. The apparatus of claim 6, further comprising an actuator configured to move the moveable drawer between an open position and a closed position, wherein the one or more processors are configured to activate the actuator based on a received user input.

8. The apparatus of claim 6, further comprising an actuator configured to move the moveable drawer between an open position and a closed position, wherein the one or more processors are configured to activate the actuator upon completion of the assessment of the mobile device.

9. The apparatus of claim 1, further comprising:
a touchscreen coupled to the housing and communicatively coupled to the one or more processors, wherein the touchscreen is configured to receive a user input associated with identifying information of the mobile device.

10. The apparatus of claim 9, wherein the one or more processors are configured to establish the wireless communication link, based at least in part on the received user input.

11. The apparatus of claim 1, wherein the remote computer includes a user interface, and wherein the user interface is configured to enable a review of the captured one or more images.

12. A computer-implemented method for assessing a mobile device, the method comprising:
causing, by one or more processors of an apparatus, a wireless communication link to be established with a mobile device positioned within a chamber of a faraday cage of the apparatus, at least in part by establishing a cell;

receiving, by the one or more processors and via the wireless communication link, information indicative of identification of the mobile device, the information indicative of identification of the mobile device including one or both of (i) an international mobile station equipment identity, and (ii) an international mobile subscriber identity;

determining, by the one or more processors, a make and a model of the mobile device based on the information indicative of identification of the mobile device;

causing, by the one or more processors, one or more imaging devices of the apparatus to capture one or more images of the mobile device while the mobile device is positioned within the chamber;

determining, by the one or more processors, a condition of the mobile device based on the one or more images of the mobile device;

determining, by the one or more processors, a monetary value of the mobile device based on (i) the make and the model of the mobile device and (ii) the determined condition of the mobile device; and providing for display to a user, by the one or more processors, an assessment of the mobile device, wherein the assessment of the mobile device includes one or more of (i) the determined condition, (ii) the determined monetary value, and (iii) an offer that is based on the determined monetary value.

13. The computer-implemented method of claim 12, wherein determining the condition comprises:

receiving, by the one or more processors, information indicative of a stock image of a corresponding mobile device according to the make and the model of the mobile device;

comparing, by the one or more processors, the information indicative of the stock image to the captured one or more images of the mobile device; and based on the comparison, determining, by the one or more processors, the condition.

14. The computer-implemented method of claim 13, wherein determining the condition further comprises:

determining, by the one or more processors, the condition based on one or more physical characteristics associated with the mobile device using image processing of (i) the information indicative of the stock image and (ii) the captured one or more images of the mobile device, wherein the one or more physical characteristics reflect damage to one or more external sides of the mobile device.

15. The computer-implemented method of claim 12, wherein causing the wireless communication link to be established comprises broadcasting cellular information via one or more antennas within the chamber.

16. The computer-implemented method of claim 12, further comprising:

activating, by the one or more processors, one or more illuminating components of the apparatus prior to causing the one or more imaging devices to capture the one or more images.

17. The computer-implemented method of claim 12, further comprising:

activating, by the one or more processors and in response to a received user input, an actuator of the apparatus to move a drawer of the apparatus between an open position and closed position.

18. A computer-implemented method for assessing a mobile device, the method comprising:

causing, by one or more processors of an apparatus, a wireless communication link to be established with a mobile device positioned within a chamber of a faraday cage, at least in part by establishing a cell;

receiving, by the one or more processors and via the wireless communication link, information indicative of identification of the mobile device, the information indicative of identification of the mobile device including one or both of (i) an international mobile station equipment identity, and (ii) an international mobile subscriber identity;

capturing, by one or more imaging devices, one or more images of the mobile device while the mobile device is positioned within the chamber;

transmitting, by the one or more processors, (i) the information indicative of identification of the mobile device and (ii) the captured one or more images of the mobile device to a remote server configured to assess the mobile device;

after transmitting to the remote server, receiving, by the one or more processors, one or more of (i) a condition of the mobile device, (ii) a monetary value of the mobile device, and (iii) an offer based on the monetary value of the mobile device; and providing for display to a user, by the one or more processors, an assessment of the mobile device, wherein the assessment of the mobile device includes one or more of (i) the condition of the mobile device, (ii) the monetary value of the mobile device, and (iii) the offer.

19. The computer-implemented method of claim 18, further comprising:

activating, by the one or more processors, one or more illuminating components of the apparatus prior to causing the one or more imaging devices to capture the one or more images.

20. The computer-implemented method of claim 18, further comprising:

activating, by the one or more processors and in response to a received user input, an actuator of the apparatus to move a drawer of the apparatus between an open position and closed position.

* * * * *